US012794473B2

(12) United States Patent
Yin et al.

(10) Patent No.: US 12,794,473 B2
(45) Date of Patent: Nov. 10, 2026

(54) CELL REGION HAVING THREE-STATE INVERTING CIRCUIT COUPLED BETWEEN A REFERENCE VOLTAGE AND A NON-REFERENCE-VOLTAGE SIGNAL AND METHOD OF MANUFACTURING SAME

(71) Applicant: TAIWAN SEMICONDUCTOR MANUFACTURING COMPANY, LTD., Hsinchu (TW)

(72) Inventors: Xing Chao Yin, Hsinchu (TW); Johnny Chiahao Li, Hsinchu (TW); Yu-Chi Chang, Hsinchu (TW); Tzu-Wei Yang, Hsinchu (TW); Yung-Chen Chien, Hsinchu (TW); Xiangdong Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 19/047,221

(22) Filed: Feb. 6, 2025

(65) Prior Publication Data

US 2026/0113040 A1 Apr. 23, 2026

Related U.S. Application Data

(60) Provisional application No. 63/708,887, filed on Oct. 18, 2024.

(51) Int. Cl.
*H03K 19/0185* (2006.01)

(52) U.S. Cl.
CPC ............................ *H03K 19/018521* (2013.01)

(58) Field of Classification Search
None
See application file for complete search history.

(56) References Cited

U.S. PATENT DOCUMENTS

| | | | | |
|---|---|---|---|---|
| 2020/0266185 | A1* | 8/2020 | Mittal | G06F 30/392 |
| 2024/0097987 | A1* | 3/2024 | Dolezilek | H04L 41/122 |
| 2024/0146286 | A1* | 5/2024 | Huang | H03K 3/0372 |
| 2024/0274592 | A1* | 8/2024 | Chang | H10D 30/027 |
| 2025/0372507 | A1* | 12/2025 | Vanaikar | G06F 30/392 |

FOREIGN PATENT DOCUMENTS

| | | |
|---|---|---|
| CN | 106656108 | 2/2020 |
| TW | 202429325 | 7/2014 |
| TW | I593233 | 7/2017 |
| TW | I665869 | 7/2019 |
| TW | 202414423 | 4/2024 |

* cited by examiner

*Primary Examiner* — Jany Richardson
(74) *Attorney, Agent, or Firm* — Hauptman Ham, LLP

(57) ABSTRACT

A circuit includes: first and second inverters configured correspondingly to receive first and second pin-signals and to generate inversions of first and second pin-signals, the first and second pin-signals correspondingly being first and second input signals of the circuit; and a three-state inverting sub-circuit including first and second data transistors and a sleep transistor, a control terminal of each of the first and second data transistors being coupled to a first node having the inversion of the second pin-signal, a control terminal of the sleep transistor being coupled to a second node having the inversion the first pin-signal, and the first and second data transistors and the sleep transistor being coupled in series between a third node having a first reference voltage and a fourth node having a non-reference-voltage (NRV) signal.

20 Claims, 21 Drawing Sheets

CELL REGION HAVING THREE-STATE INVERTING CIRCUIT COUPLED BETWEEN A REFERENCE VOLTAGE AND A NON-REFERENCE-VOLTAGE SIGNAL AND METHOD OF MANUFACTURING SAME

PRIORITY CLAIM

The application claims the priority of U.S. Provisional Application No. 63/708,887, filed Oct. 18, 2024, which is incorporated herein by reference in its entirety.

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
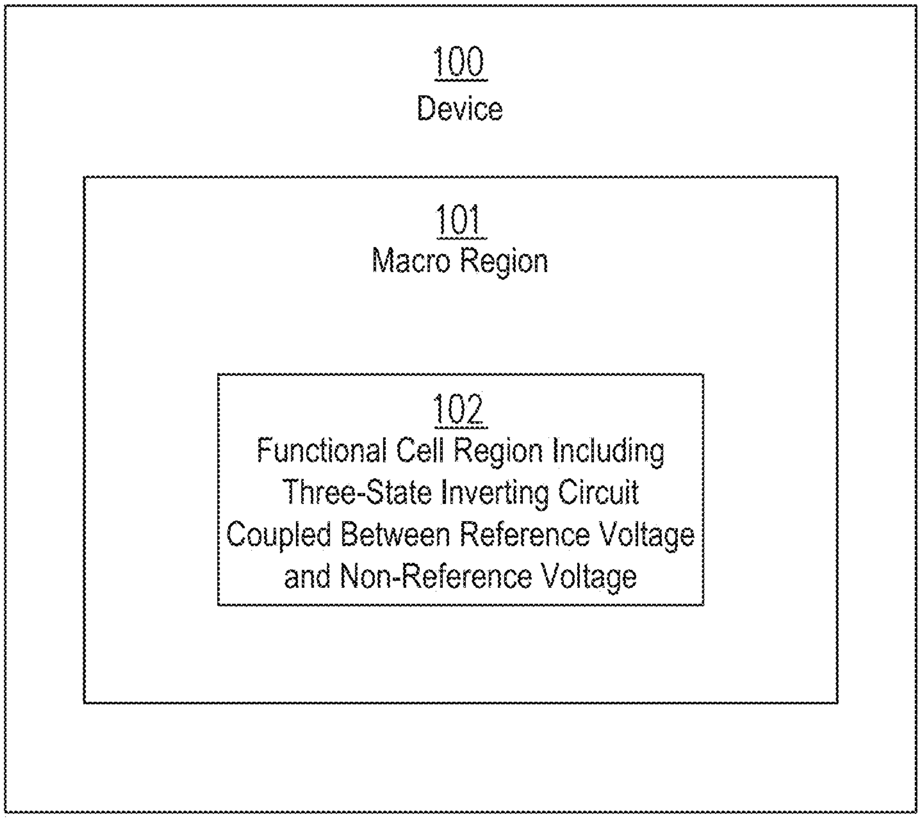
FIG. 1 is a block diagram, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a cell region (of a device) includes: first and second inverters configured correspondingly to receive first and second pin-signals and to generate inversions of first and second pin-signals, the first and second pin-signals correspondingly being first and second input signals of the circuit; and a three-state inverting sub-circuit including three transistors, namely first and second data transistors and a sleep transistor. A control terminal of each of the first and second data transistors is coupled to a first node having the inversion of the second pin-signal. A control terminal of the sleep transistor is coupled to a second node having the inversion the first pin-signal. The first and second data transistors and the sleep transistor are coupled in series between a third node having a first reference voltage and a fourth node having a non-reference-voltage (NRV) signal. In some embodiments, the NRV signal is the inversion the first pin-signal.

Consider another approach for producing a three-state inverter that is a counterpart to the three-transistor (3T) three-state (3S) inverting sub-circuit (3T3S-inverter). The counterpart three-state inverter has four transistors instead of three transistors, and is referred to herein as a first counterpart 4T3S-inverter. The first counterpart 4T3S-inverter includes 3 transistors that are counterparts to the first and second data transistors and the sleep transistor, and additionally includes a fourth transistor. The other approach's fourth transistor is (i) coupled between the counterpart first transistor and a first reference voltage or (ii) coupled between the counterpart third transistor and a second reference voltage. A control terminal, i.e., the gate terminal, of each of the counterpart first data transistor and the counterpart data second transistor is configured to receive a counterpart inversion of a counterpart second pin-signal. A control terminal, i.e., the gate terminal, of the counterpart sleep transistor is configured to receive a counterpart inversion of a counterpart first pin-signal. A control terminal, i.e., the gate terminal, of the other approach's fourth transistor is configured to receive a counterpart of pin-signal A1. Due to the effect on gate capacitance induced by a pin-signal as contrasted with an internal signal, the other approach's fourth transistor experiences a relatively larger gate capacitance than the gate capacitances experienced by the counterpart first to third transistors. As such, the switching speed of the other approach's fourth transistor is relatively slower than the switching speed of the counterpart first to third transistors, which slows down operating speed of the other approach's first 4T3S-inverter. By contrast, none of the gate terminals of the transistors in the 3T3S-inverter is coupled to a pin-signal. Accordingly, by avoiding having a transistor whose gate terminal is coupled to a pin-signal, e.g., by not including the other approach's fourth transistor, the transistors of the 3T3S-inverter experience relatively lower gate capacitances which increases the operating speed of 3T3S-inverter as compared to the operating speed of the other approach's first 4T3S-inverter.

FIG. 1 is a block diagram of a cell region 102 of a device 100, in accordance with some embodiments.

Device 100 is an example of an integrated circuit (IC). In some embodiments, device 100 is referred to as a semiconductor device. Device 100 includes a macro region 101. Macro region 101 includes a functional cell region 102. Functional cell region 102 includes a three-state inverting circuit (see, e.g., FIGS. 2A-2D) coupled between a reference voltage and a non-reference-voltage signal. In some embodiments, functional cell region 102 includes one or more active devices, passive devices, or the like. Examples of active devices or active elements include, but are not limited to, transistors, diodes, or the like. Examples of passive elements include, but are not limited to, capacitors, inductors, fuses, resistors, or the like.

In some embodiments, macro region 101 is comprised of one or more instances of functional cell region 102 and/or one or more other functional cell regions. In such embodiments, macro region 101 is configured to provide/execute a given computational function which is comprised of less complicated functions provided correspondingly by the instances of functional cell region 102 and/or the one or more other functional cell regions. In some embodiments, one or more instances of functional cell region 102 and/or one or more other functional cell regions represent intercoupled building blocks which comprise macro region 101.

In some embodiments, macro region 101 is understood in the context of an analogy to the architectural hierarchy of modular programming, in which subroutines/procedures are called by a main program (or by other subroutines) to carry out a given computational function. In this context, device 100 uses macro region 101 to perform one or more given functions. Accordingly, in this context and in terms of architectural hierarchy, device 100 is analogous to the main program and macro region 101 is analogous to subroutines/procedures. In some embodiments, macro region 101 is a soft macro. In some embodiments, macro region 101 is a hard macro. In some embodiments, macro region 101 is a soft macro which is described digitally in register-transfer level (RTL) code. In some embodiments, synthesis, placement, and routing have yet to have been performed on macro region 101 such that the soft macro can be synthesized, placed, and routed for a variety of process technology nodes. In some embodiments, macro region 101 is a hard macro which is described digitally in a binary file format (e.g., Graphic Database System II (GDSII) stream format), where the binary file format represents planar geometric shapes, text labels, other information, and the like of one or more layouts of macro region 101 in hierarchical form. In some embodiments, a binary file format is referred to as a non-text file format. In some embodiments, synthesis, placement, and routing have been performed on macro region 101 such that the hard macro is specific to a particular process technology node.

In some embodiments, examples of functions provided by a macro region (e.g., macro region 101) include a memory, a power grid, a clock tree, an adder, a phase-locked loop (PLL), a delay-locked loop (DLL), a flip-flop, a shift register, an analog-to-digital converter (ADC), a digital-to-analog converter (DAC), interfaces, higher-level Boolean logic, or the like. Example memories include a static random access memory (SRAM), a dynamic RAM (DRAM), a resistive RAM, a magnetoresistive RAM (MRAM), a read only memory (ROM), or the like. An example of a flip-flop is a scan-insertion type of D flip-flop (SDFQ), or the like. In some embodiments, examples of functions provided by functional cell regions (e.g., functional cell region 102) include an inverter, a buffer, a latch a multiplexer (MUX), a driver, a latch, delay, a half adder, a full adder, a compressor, lower-level Boolean logic, or the like, Examples of lower-level Boolean logic include AND, OR, NAND, NOR, XOR, INV, AND-OR-Invert (AOI) (see, e.g., FIG. 5A), OR-AND-Invert (OAI), or the like.

Figure 3A:
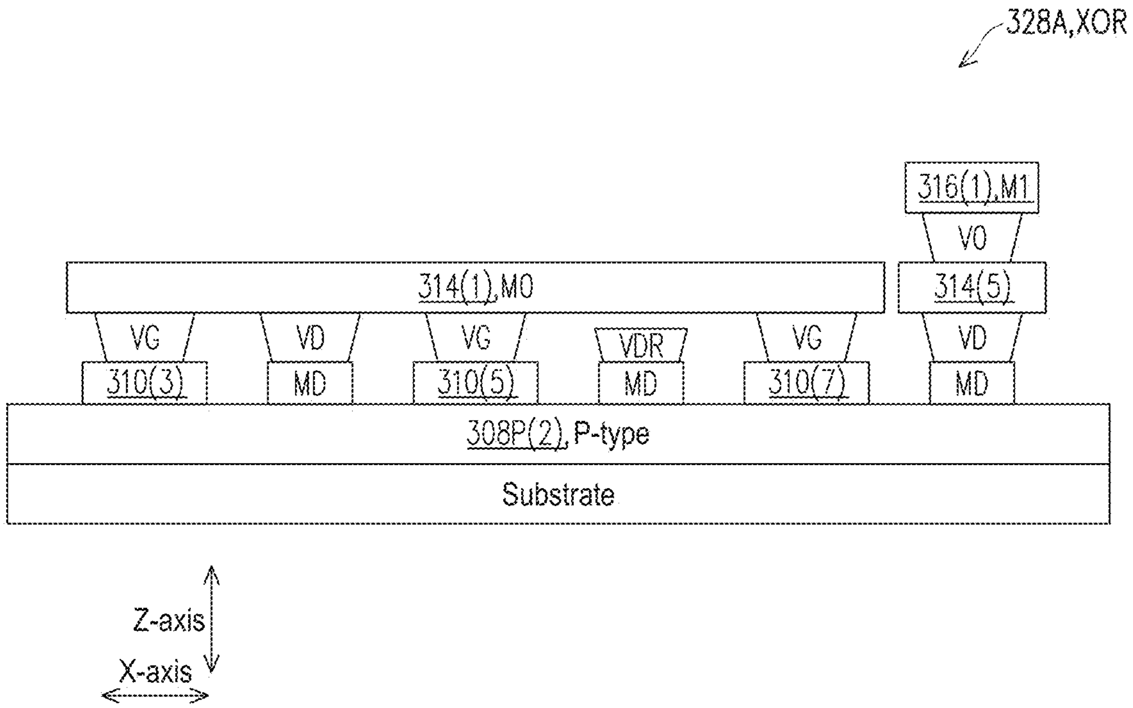
FIGS. 3A-3B are corresponding cross-sections, in accordance with some embodiments.
Figure 3B:
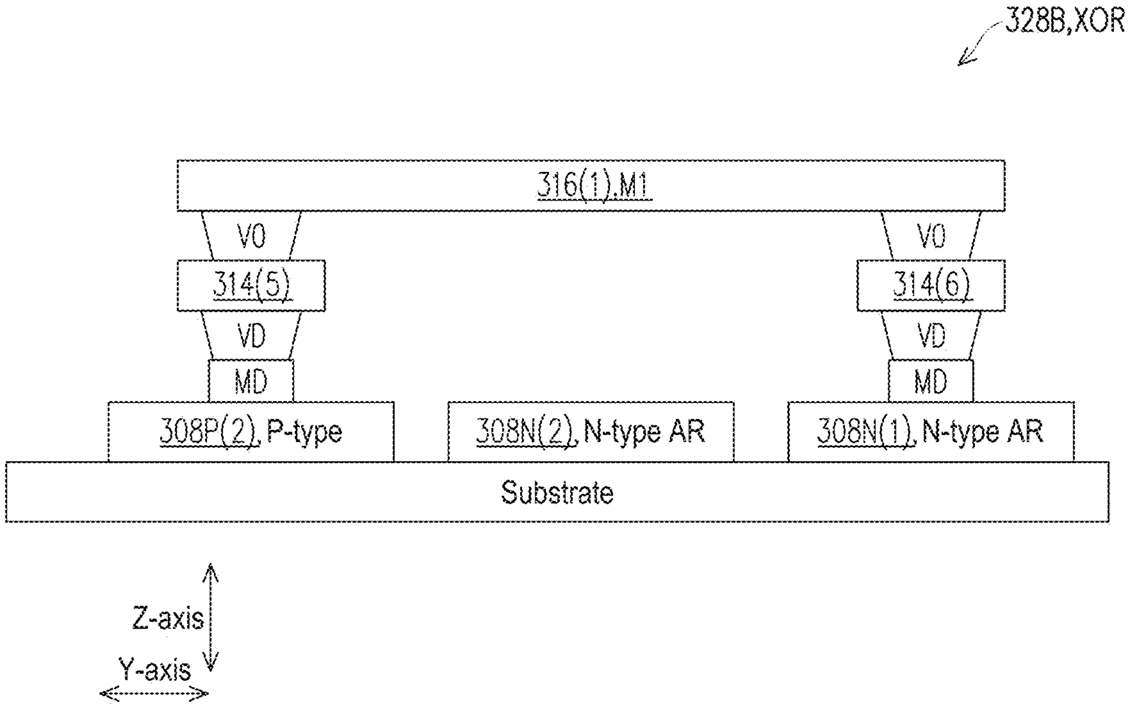

Functional cell region 102 includes corresponding segments in one or more metallization layers (see, e.g., FIGS. 3A-3B). Figures of the present disclosure assume a Cartesian coordinate system (unless noted otherwise) in which first, second and third directions are, e.g., correspondingly parallel to the X-axis, the Y-axis and the Z-axis. In some embodiments, the first to third directions correspond to directions other than the X-axis, Y-axis and Z-axis. In some embodiments, long and short axes of the segments extend correspondingly in the first and second directions in even ones of the metallization layers; in such embodiments, long and short axes of the segments extend correspondingly in the second and first directions in odd ones of the metallization layers. In such embodiments, boundaries of functional cell region 102 are described in terms of the first and second directions.

In some embodiments, functional cell region 102 corresponds to a transistor-components layer (see, e.g., FIGS. 3A-3B) having circuitry components, e.g., transistors, formed thereon in a front-end-of-line (FEOL) fabrication. In functional cell region 102, above and/or below an active region (AR) layer (see, e.g., FIGS. 3A-3B), various metal layers (see, e.g., FIGS. 3A-3B) are interleaved with corresponding interconnection layers (see, e.g., FIGS. 3A-3B) are stacked over and/or under insulating layers in a back end of line (BEOL) fabrication. The BEOL fabrication provides a power network and/or routing for circuitry of device 100, including macro region 101 and functional cell region 102.

Figure 2A:
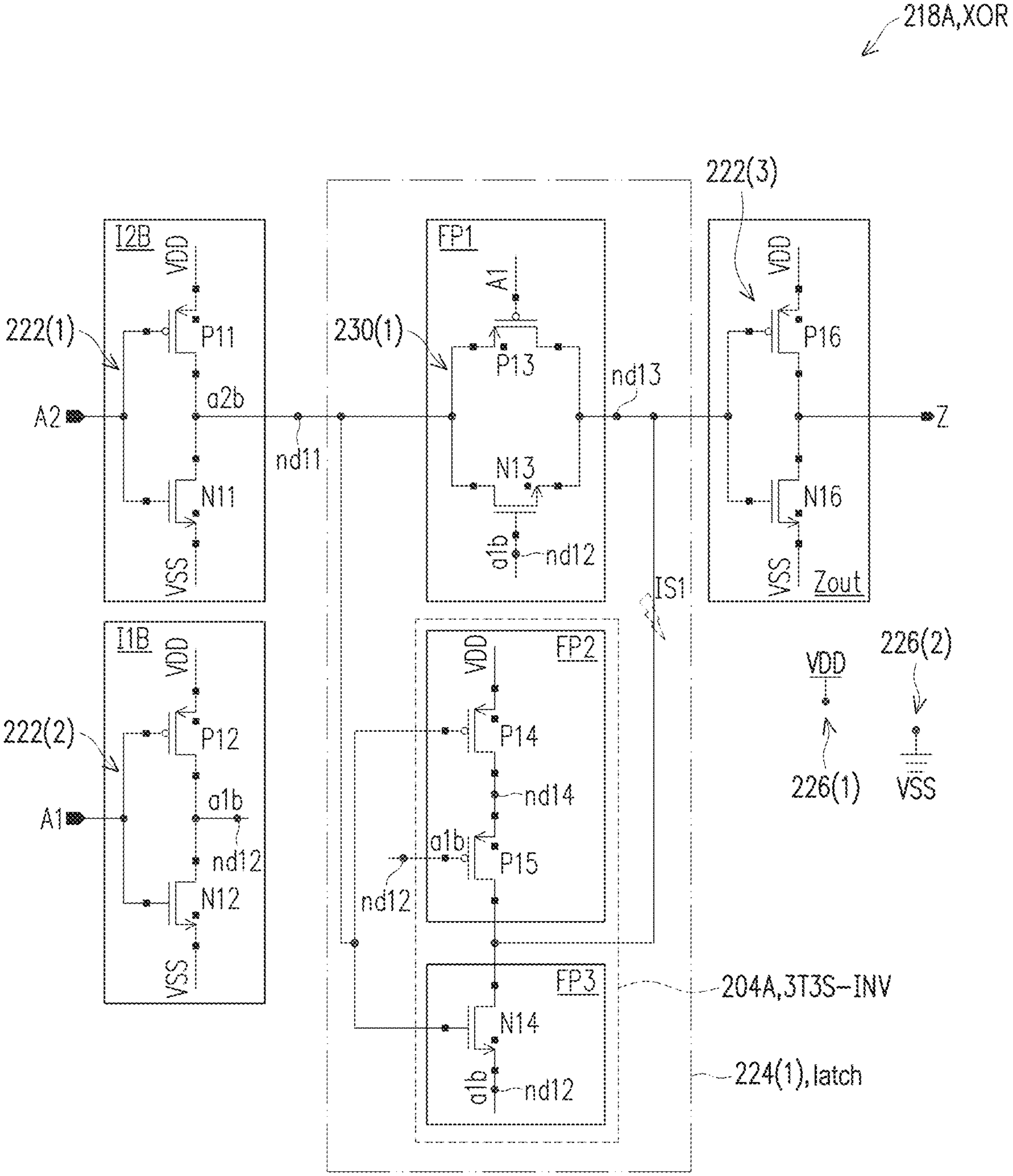
FIGS. 2A and 2C are corresponding circuit schematic diagrams, in accordance with some embodiments.

FIG. 2A is a circuit schematic diagram of an Exclusive OR logic (XOR) circuit 218A, in accordance with some embodiments.

XOR circuit 218A is a two input XOR circuit. XOR circuit 218A is comprised of field effect transistors (FETs) and is an example of one type of complementary metal-oxide-semiconductor (CMOS) architecture. The FETs include negative-channel metal-oxide semiconductor (NMOS) FETs (NFETs) and positive-channel metal-oxide semiconductor (PMOS) FETS (PFETs). XOR circuit 218A includes PFETs P11-P16 and NFETs N11-N14 and N16. In FIG. 2A, boxes I2B, I1B, FP1, FP2, FP3 and Zout overlap corresponding ones of P11-P16, N11-N14 and N16; such boxes help to indicate correspondences between the FETs in FIG. 2A and the FETs in FIG. 2B. XOR circuit 218A includes: a latch 224(1) coupled between an inverter 222(1) and an inverter 222(3); and an inverter 222(2).

Inverter 222(1) includes P11 and N11 coupled in series between a node 226(1) having a first reference voltage, e.g., VDD, and a node 226(2) have a second reference voltage, e.g., VSS. Inverter 222(1) is configured to receive a pin-signal A2 and generate a signal a2*b* on a node nd11, where signal a2*b* is an inversion of pin-signal A2, and where signal a2*b* is an internal signal relative to XOR circuit 218A. In some embodiments, in general, a pin-signal is generated externally to the circuit and represents an input to a circuit; as such, a pin-signal also is coupled to something which is external to the circuit. In such embodiments, a pin-signal contrasts with an internal signal, where the latter is generated internally to the circuit and is not coupled to anything which is external to the circuit. In such embodiments, a pin-signal also contrasts with an output signal of the circuit, i.e., a signal that is generated internally to the circuit but which is coupled to something which is external to the circuit. Accordingly, pin-signal A2 is an input to XOR circuit 218A.

Inverter 222(2) includes P12 and N12 coupled in series between VDD and VSS. Inverter 222(2) is configured to receive a pin-signal A1 and generate a signal a1*b* on a node nd12, where signal a1*b* is an inversion of pin-signal A1, and where signal a1*b* is an internal signal relative to XOR circuit 218A.

In FIG. 2A, inverter 222(3) includes P16 and N16 coupled in series between VDD and VSS. Inverter 222(3) is configured to receive an internal signal IS1 on a node nd13 and generate a signal Z, where signal Z is an inversion of signal IS1, and where signal Z represents an output of XOR circuit 218A.

Latch 224(1) is coupled between nodes nd11 and nd13. Latch 224(1) includes a three-state inverting circuit 204A and a transmission gate 230(1) coupled in parallel between nodes nd11 and nd13.

Transmission gate 230(1) is coupled between nodes nd11 and nd13; as such, nodes nd11 and nd13 correspondingly represent the input and output of transmission gate 230(1). Transmission gate 230(1) includes P13 and N13 coupled in parallel between nodes nd11 and nd13. A control terminal, i.e., the gate terminal, of P13 is configured to receive pin-signal A1. A control terminal, i.e., the gate terminal, of N13 is configured to receive signal a1*b*.

In FIG. 2A, three-state (3S) inverting (3S-INV) circuit 204A is coupled between nodes nd11 and nd13; as such, nodes nd11 and nd13 correspondingly represent the input and output of 3S-INV 204A. 3S-INV circuit 204A includes three FETs and so is referred to herein as 3T3S-INV circuit 204A. 3T3S-INV circuit 204A includes P14, P15 and N14 coupled in series between VDD and a non-reference-voltage (NRV) signal, where the NRV signal is internal signal a1*b* in the example of FIG. 2A. P14 is coupled between VDD and a node nd14. P15 is coupled between node nd14 and node nd13. N14 is coupled between node nd13 and the NRV signal, i.e., is coupled between node nd13 and signal a1*b*. The drain of N14 is coupled to node nd13. The source of N14 is coupled to the NRV signal, i.e., to signal a1*b*. A control terminal, i.e., the gate terminal, of each of P14 and N14 is configured to receive signal a2*b*. A control terminal, i.e., the gate terminal, of P15 is configured to receive signal a1*b*.

In general, regarding an FET, a larger gate capacitance results in a longer charging time such that the FET is slower to turn on, and a smaller gate capacitance results in a shorter charging time such that the FET is quicker to turn on. A longer turn-on time results in slower switching by the FET, i.e., slower switching speed. A shorter turn-on time results in faster switching by the FET, i.e., faster switching speed. In general, regarding an FET that is included in a functional circuit, gate capacitance of the FET differs based on the type of signal to which the gate terminal is coupled. Generally, the FET experiences a larger gate capacitance where the gate terminal of the FET is coupled to a pin-signal than where the gate terminal is coupled to an internal signal, i.e., to a signal that is internal to the circuit of which the FET is a part.

Consider another approach for producing a three-state inverter that is a counterpart to 3T3S-INV 204A. The counterpart three-state inverter has four FETs instead of three FETs, and is referred to herein as a second counterpart 4T3S-inverter. second counterpart The second counterpart 4T3S-inverter includes a first PFET which is a counterpart to P14, a second PFET which is a counterpart to P15, a first NFET which is a counterpart to N14, and a second NFET coupled between the counterpart first NFET and VSS. A control terminal, i.e., the gate terminal, of each of the counterpart first PFET and the counterpart second NFET is configured to receive a counterpart of internal signal a2*b*. A control terminal, i.e., the gate terminal, of the counterpart second PFET is configured to receive a counterpart of internal signal a1*b*. A control terminal, i.e., the gate terminal, of the counterpart second PFET is configured to receive a counterpart of pin-signal A1.

Due to the effect on gate capacitance induced by a pin-signal as contrasted with an internal signal, the other approach's second NFET experiences a relatively larger gate capacitance than the gate capacitances experienced by the counterpart first PFET, the counterpart second PFET and the counterpart first NFET. As such, the switching speed of the other approach's second NFET is relatively slower than the switching speed of at least the counterpart first NFET, which slows down operating speed of the other approach's first 4T3S-inverter. By contrast, the gate terminals of each of P14-P15 and N14 of 3T3S-INV circuit 204A are coupled to internal signals such that none of the gate terminals of the FETs in 3T3S-INV circuit 204A is coupled to a pin-signal. Accordingly, by avoiding having an FET whose gate terminal is coupled to a pin-signal, e.g., by not including the other approach's second NFET, the FETs of 3T3S-INV circuit 204A experiences relatively lower gate capacitances which increases the operating speed of 3T3S-INV circuit 204A as compared to the operating speed of the other approach's first 4T3S-inverter.

Consider another approach for producing an XOR circuit that is a counterpart to XOR circuit 218A and that includes the other approach's first 4T3S-inverter. The relatively slower operating speed of the other approach's first 4T3S-inverter contributes to a relatively slower operating speed of the counterpart XOR circuit. By contrast, the relatively faster operating speed of 3T3S-INV circuit 204A contributes to a relatively faster operating speed of XOR circuit 218A as compared to the operating speed of the counterpart XOR circuit.

Figure 2B:
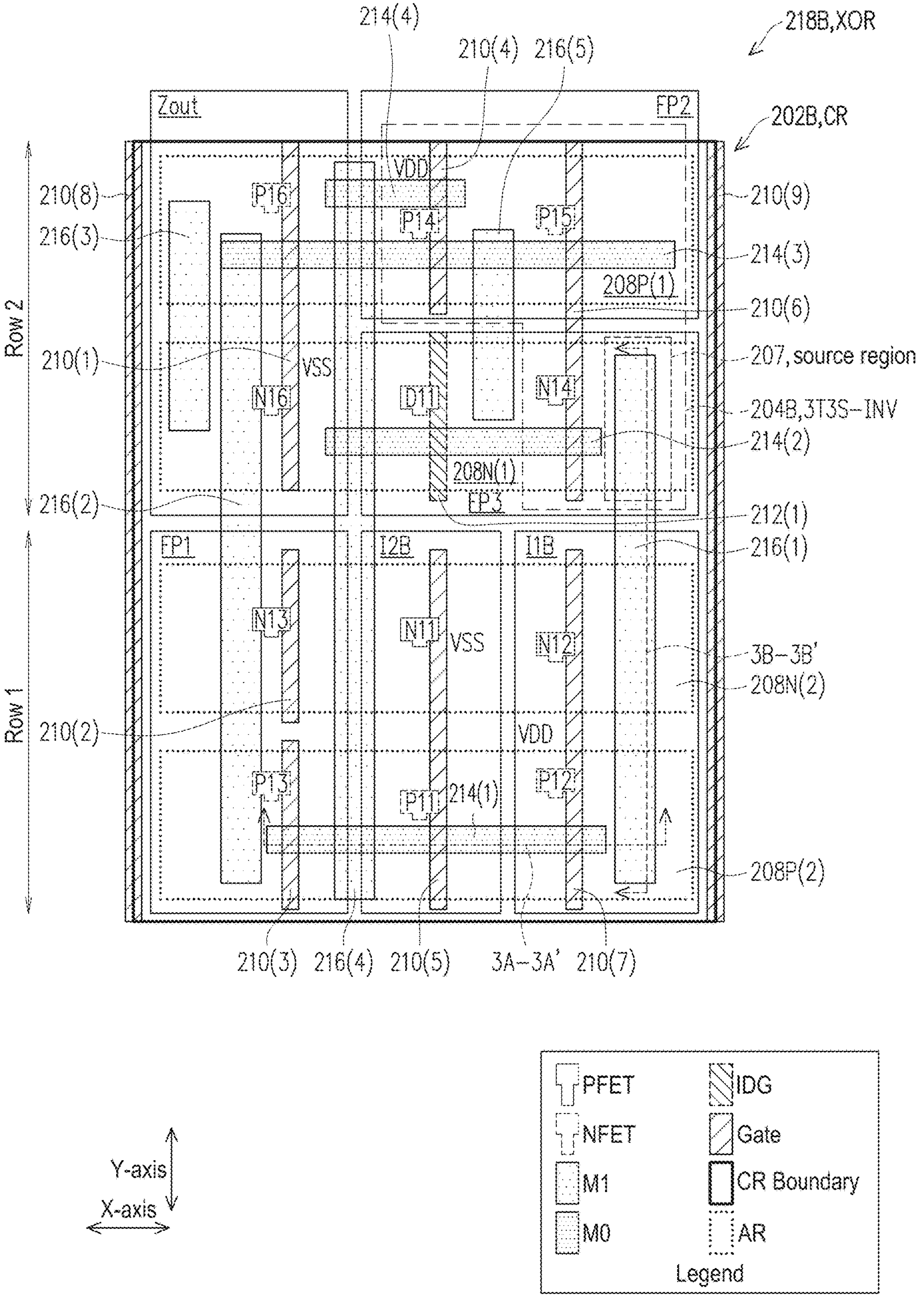
FIGS. 2B and 2D are corresponding layout diagrams, in accordance with some embodiments.

FIG. 2B is a layout diagram of a functional cell region (CR) 202B, in accordance with some embodiments.

Cell region 202B is an example of functional cell region 102 of FIG. 1. Cell region 202B is arranged relative to the following: alpha track (or alpha lines) (not shown) that extend parallel to the X-axis, and beta tracks (beta lines) (not shown) that extend parallel to the Y-axis.

In FIG. 2B, and in other layout diagrams disclosed herein, the first and second directions are assumed to be parallel correspondingly to the X-axis and the Y-axis. In some embodiments, the first and second directions are assumed to have orientations other than being parallel correspondingly to the X-axis and the Y-axis. In FIG. 2B, and in other layout diagrams disclosed herein, rows extend parallel to the X-axis and overlap corresponding ones of the alpha tracks.

The layout diagram of FIG. 2B, and other layout diagrams disclosed herein, are representative of a transistor-based device. Structures in the device are represented by patterns (also known as shapes) in the layout diagram. For simplicity of discussion, elements in the layout diagrams of FIG. 2B (and also in other layout diagrams disclosed herein) will be referred to as if they are structures rather than patterns. For example, shapes in FIG. 2B representing instances of M0 segments are referred to as M0 segments per se rather than as M0 shapes.

A layout diagram is a top view. Shapes in the layout diagram are two-dimensional relative to, e.g., the X-axis and the Y-axis, whereas the device being represented is three-dimensional. As such, a shape in such layout diagrams is described as having a width/length relative to the X-axis and a height relative to the Y-axis. Relative to the Z-axis, e.g., a bottom/back side of a first component being represented in the layout diagram is stacked on a top/front side of a second component device being represented in the layout diagram, or a top/front back side of the first component is stacked, e.g., under a bottom/back side of the second component.

Typically, relative to the Z-axis, the device is organized as a stack of layers in which are located corresponding structures, i.e., to which belong corresponding structures. Each shape in the layout diagram represents, more particularly, a component in a corresponding layer of the corresponding device. Also, typically, the layout diagram represents relative depth, i.e., positions along the Z-axis, of shapes and corresponding layers by superimposing a second shape on a first shape so that the second shape at least partially overlaps the first shape. For simplicity of illustration, some structures which have a first order of stacking along the Z-axis in the device are represented in the layout diagram using a second order of stacking along the Z-axis, i.e., a different/distorted stacking order.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding device are represented, i.e., selected layers of the layout diagram are omitted, e.g., for simplicity of illustration. Alternatively, and/or additionally, in some circumstances, not all elements of a given depicted layer of the corresponding device are represented, i.e., selected elements of the given depicted layer of the layout diagram are omitted, e.g., for simplicity of illustration. The layout diagrams disclosed herein are examples of layout diagrams in which selected layers and/or selected elements of depicted given layers, have been omitted.

In some embodiments, an isolation dummy gate (IDG) structure is a dielectric structure that includes one or more dielectric materials and functions as an electrical isolation structure. Accordingly, an IDG structure is not a structure that is electrically conductive and thus does not function, e.g., as an active gate of a transistor. An IDG structure includes one or more dielectric materials and functions as an electrical isolation structure. In some embodiments, an IDG structure is based on a gate segment as a precursor. In some embodiments, an IDG structure is based on a dummy gate structure. In some embodiments, a dummy gate structure includes a gate segment that is decoupled so as to not function, e.g., as a gate of a transistor, a gate-insulator layer, (optionally) one or more spacers, or the like. In some embodiments, an IDG structure is formed by first forming a gate segment e.g., which is included in a dummy gate structure, sacrificing/removing (e.g., etching) the gate segment to form a trench, (optionally) removing a portion of a substrate that previously had been under or over or around the gate segment to deepen the trench, and then filling the trench with one or more dielectric materials such that the physical dimensions of the resultant electrical isolation structure, i.e., the IDG, are similar to the dimensions of the gate segment which was sacrificed. In some embodiments, an IDG is a dielectric feature that includes one or more dielectric materials (e.g., oxide, nitride, oxynitride, or other suitable materials), and functions as an isolation feature. In some embodiments, an IDG is a continuous polysilicon on oxide diffusion (OD) edge structure, and is referred to as a CPODE structure.

Depending upon the numbering convention of the corresponding process technology node by which a device is to be fabricated, on a front side (see, e.g., FIGS. 3A-3B) of the device the first layer metallization is either metallization layer zero (MET0) or metallization layer one (MET1), and correspondingly a first interconnection layer on the first metallization layer is either interconnection layer zero (VIA0) or interconnection layer one (VIA1). In such embodiments, again depending upon the numbering convention of the corresponding process technology node, on a back side (not shown) of the device, the first buried metallization layer is either buried metallization layer zero (BMET0) or buried metallization layer one (BMET1), and correspondingly a first buried interconnection layer under the first metallization layer is either interconnection layer zero (VIA0) or interconnection layer one (VIA1).

In general regarding the figures disclosed herein (unless noted otherwise), the following nomenclature is adopted regarding the front side of a device: the first metallization layer is assumed to be MET0; the first interconnection layer is assumed to be VIA0; the second metallization layer is assumed to be MET1; the second interconnection layer is assumed to be VIA1; and the third metallization layer is assumed to MET2. Metallization segments in layer MET0 are referred to as M0 segments. Via structures in layer VIA0 are referred to as V0 structures. Metallization segments in layer MET1 are referred to as M1 segments. Via structures in layer VIA1 are referred to as V1 structures. Metallization segments in layer MET2 are referred to as M2 segments.

In general, regarding the figures disclosed herein (unless noted otherwise), or the like, the following nomenclature is adopted regarding the back side of a device: the first buried metallization layer is assumed to be BMET0; the first buried interconnection layer is assumed to be BVIA0; the second buried metallization layer is assumed to be BMET1; the second buried interconnection layer is assumed to be BVIA1; and the third buried metallization layer is assumed to BMET2. Metallization segments in layer BMET0 are referred to as buried M0 (BM0) segments. Via structures in layer BVIA0 are referred to as BV0 structures. Metallization segments in layer BMET1 are referred to as buried M1 (BM1) segments. Via structures in layer BVIA1 are referred to as BV1 structures. Metallization segments in layer BMET2 are referred to as buried M2 (BM2) segments.

Components included in cell region 202B include: positive-type (p-type) active regions (ARs) 208P(1)-208P(2) that extend substantially parallel to the X-axis and are used for corresponding PFETs; negative-type (n-type) ARs 208N(1)-208N(2) that extend substantially parallel to the X-axis and are used for corresponding NFETs; gate segments 210(1)-210(9) that extend substantially parallel to the Y-axis; an IDG 212(1) that extends substantially parallel to the X-axis; M0 segments 214(1)-214(4) that extend substantially parallel to the X-axis; and M1 segments 216(1)-216(5) that extend substantially parallel to the Y-axis.

Figure 2C:
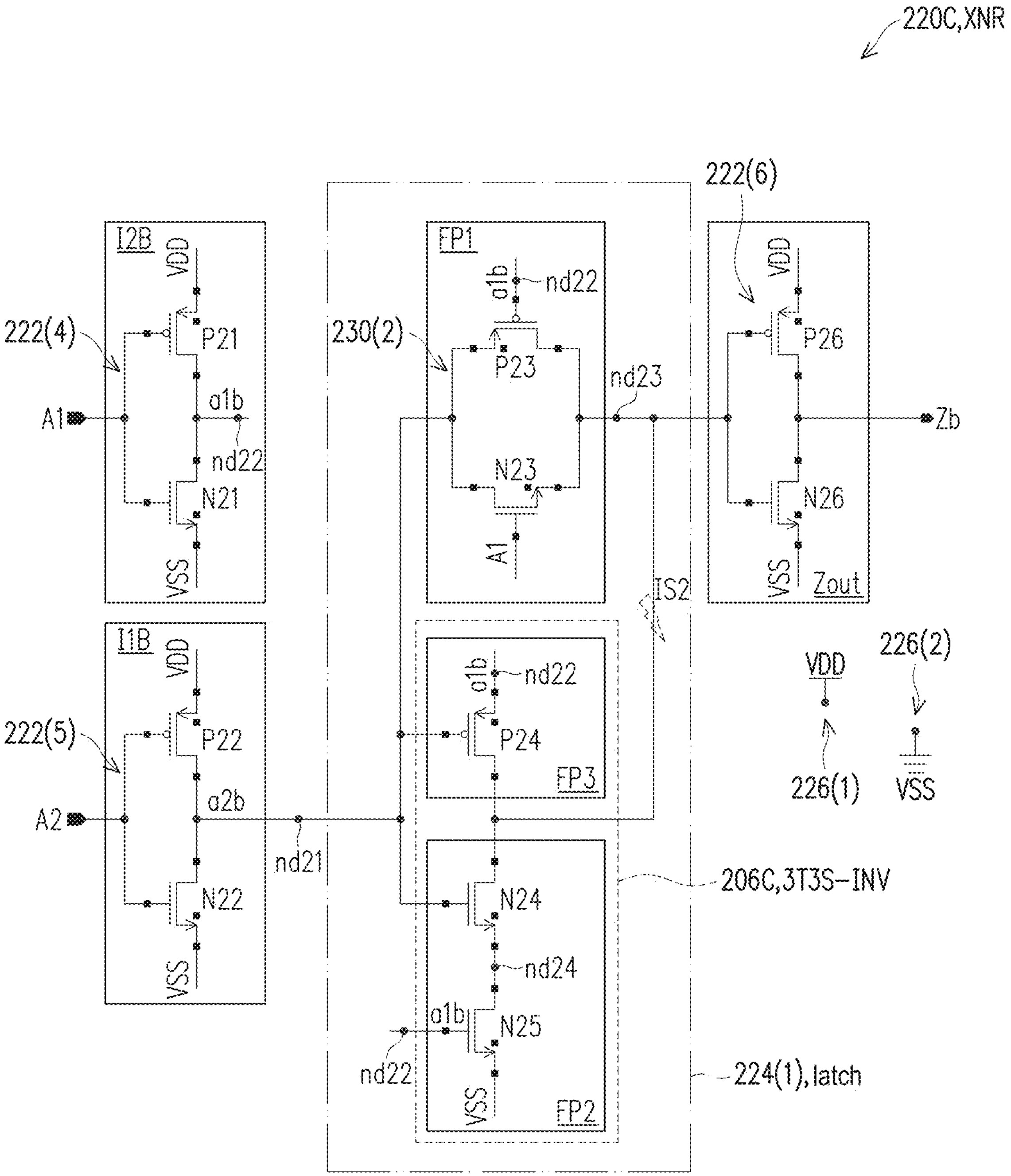

In FIG. 2B, boxes I2B, I1B, FP1, FP2, FP3 and Zout overlap corresponding ones of P11-P16, N11-N14 and N16; such boxes help to indicate correspondences between the FETs in FIG. 2B and the FETs in FIG. 2C. Gate segments 210(8) and 210(9) substantially align correspondingly to left and right boundaries of cell region 202B. Relative to the Y-axis: upper ends of gate segments 210(1), 210(4), 210(6) and 210(8)-210(9) substantially align to a top boundary of cell region 202B; and lower ends of gate segments 210(3), 210(5) and 210(7)-210(9) substantially align to a bottom boundary of cell region 202B.

The function of cell region 202B is that of an XOR circuit. As such, cell region 202B is an example of XOR circuit 218A of FIG. 2A. Accordingly, cell region 202B is also referred to herein as XOR circuit 218B. In FIG. 2B, section line 3A-3A' corresponds to the cross-section of FIG. 3A. In FIG. 2B, section line 3B-3B' corresponds to the cross-section of FIG. 3B.

Relative to the Y-axis: ARs 208N(1) and 208N(2) are between ARs 208P(1) and 208P(2); AR 208N(1) is between AR 208P(1) and AR 208N(2); and AR 208N(2) is between AR 208N(1) and AR 208P(2). AR 208P(1) and AR 208N(1) are in row 1. AR 208N(2) and AR 208P(2) are in row 2.

In FIG. 2B, relative to the X-axis, adjacent ones of gate segments 210(1)-210(9) are separated from each other by a uniform distance/pitch, p_gate. A value for pitch p_gate depends on the corresponding semiconductor process technology node. In some embodiments, pitch p_gate represents one contacted poly pitch (CPP) for the corresponding semiconductor process technology node. Here, the word 'poly' in the term CPP does not necessarily imply that the gate structures in semiconductor devices based correspondingly on FIG. 2B, or the like, are to be formed of polysilicon but instead represents a historical convenience, i.e., because gate structures in ICs manufactured according to a predecessor semiconductor process technology node often were formed of polysilicon. In the example of FIG. 2B, relative to the X-axis, a width of cell region 202B, w_202B, is equal to 4*p_gate such that w_202B=(4*p_gate). In some embodiments, a width of a cell region, w_CR, is different than w_202B.

In FIG. 2B, and in the other figures disclosed herein: the M0 segments are aligned to corresponding ones of the alpha tracks (not shown); and the gate segments, the MD structures (e.g., see FIGS. 3A-3B) and the IDG(s) are aligned to corresponding ones of the beta tracks (not shown).

In general, where an MD structure overlaps an active region, the overlapped portion of the active region is configurable as a source region or as a drain region, i.e., the overlapped portion of the active region can be doped to serve as source region of a transistor or as a drain region of a transistor. In some embodiments, in the context of NMOS transistor technologies having an N-type active region, a source region and a drain region are doped with one or more N-type dopants relatively more heavily than other regions of the active region, with the source and drain regions being doped in substantially the same manner. In some embodiments, in the NMOS context, a source region and a drain region are doped with a substantially different sets of one or more N-type dopants, each of the source and drain region nevertheless being relatively more heavily doped than other regions of the active region. In some embodiments, in the NMOS context, a source region and a drain region are doped with the same sets of one or more N-type dopants albeit under different sets of doping process parameters, each of the source and drain region nevertheless being relatively more heavily doped than other regions of the active region. In some embodiments, in the context of PMOS transistor technologies having a P-type active region, a source region and a drain region are doped with one or more P-type dopants relatively more heavily than other regions of the active region, with the source and drain regions being doped in substantially the same manner. In some embodiments, in the PMOS context, a source region and a drain region are doped with a substantially different sets of one or more P-type dopants, each of the source and drain region nevertheless being relatively more heavily doped than other regions of the active region. In some embodiments, in the PMOS context, a source region and a drain region are doped with the same sets of one or more P-type dopants albeit under different sets of doping process parameters, each of the source and drain region nevertheless being relatively more heavily doped than other regions of the active region.

Also, in general, where a gate segment overlaps a portion of an active region that is between two adjacent source/drain (S/D) regions, the gate segment, the two adjacent S/D regions and the overlapped portion of the active region represent an FET. The portion of the active region between the two adjacent S/D regions represents a channel region of the FET.

In FIG. 2B, P14-P16 are formed in AR 208P(1). N14, N16 and a dummy FET D11 are formed in AR 208N(1). Dummy D11 includes IDG 212(1) in place of a corresponding gate segment, hence D11 is a dummy FET and not an NFET. N11-N13 are formed in AR 208N(2). P11-P13 are formed in AR 208P(2).

Gate segment 210(7) is over each of the AR 208N(2) and AR 208P(2) and is configured to receive pin-signal A1. Gate segment 210(6) is over AR 208N(1) and AR 208P(1), is configured to receive signal a2*b*, and is substantially collinear with gate segment 210(7).

Regarding first S/D regions in AR 208N(2) and AR 208P(2) that are adjacent the right side of gate segment 210(7), the first S/D regions are coupled together and are configured to provide signal a1*b*. Regarding a first S/D region in AR 208N(1) that is adjacent the right side of gate segment 210(6), the first S/D region is configured to receive signal a1*b*. Regarding second S/D regions in each of AR 208N(2) and AR 208P(2) ARs adjacent the left side of the first gate segment 210(7), the second S/D regions are correspondingly configured to receive VSS and VDD.

Regarding a first S/D region in the AR 208N(1) that is adjacent the right side of gate segment 210(6), the first S/D region is configured to receive a non-reference-voltage (NRV) signal, where the NRV signal is internal signal a1*b* in the example of FIG. 2B. Further regarding the first S/D region in the AR 208N(1), the first S/D region functions as a source region of N14, and is allotted reference number 207 in FIG. 2B. Together, P14-P15 and N14 comprise 3T3S-INV 204B in FIG. 2B, where 3T3S-INV 204B of FIG. 2B corresponds to 3T3S-INV 204A of FIG. 2A.

Gate segment 210(5) is over each of AR 208N(2) and AR 208P(2) and is configured to receive pin-signal A2. Second S/D regions in AR 208N(2) and AR 208P(2) also are adjacent the right side of gate segment 210(5). Third S/D regions in the AR 208N(2) and AR 208P(2) are adjacent the left side of gate segment 210(5), are coupled together, and are configured to provide signal a2*b*.

Gate segment 210(2) is over the AR 208N(2) and is configured to receive signal a1*b*. Gate segment 210(3) is over AR 208P(2) and is configured to receive pin-signal A1. The third S/D regions in the AR 208N(2) FIG. 2D and AR 208P(2) correspondingly also are adjacent the right side of gate segment 210(2) and gate segments 210(3). Fourth S/D regions in AR 208N(2) and AR 208P(2) correspondingly are adjacent the left side of gate segment 210(2) and gate segment 210(3), are coupled together and are configured to provide internal signal IS1.

M0 segment 214(1) overlies AR 208P(2) and each of gate segments 210(7), 210(5) and 210(3) and is coupled to each of gate segment 210(7) and 210(3). M0 segment 214(1) is free of being coupled to gate segment 210(5).

IDG 212(1) is over AR 208N(1) and substantially collinear with gate segments 210(3) and 210(5). The right side of IDG 212(1) is adjacent to the left side of gate segment 210(6). A second S/D region in the AR 208N(1) is adjacent the right side of IDG 212(1). A third S/D region in AR 208N(1) is adjacent the left side of IDG 212(1) and is configured to receive signal a2*b*.

FIG. ncircuit schematic diagram of an Exclusive NOR logic (XNR) circuit 220C, in accordance with some embodiments.

XNR circuit 220C is a two input XNR circuit. XNR circuit 220C is comprised of FETs and is an example of one type of CMOS architecture. XNR circuit 220C includes PFETs P21-P24 and P26 and NFETs N21-N26. In FIG. 2C, boxes I2B, I1B, FP1, FP2, FP3 and Zout overlap corresponding ones of P21-P24, P26 and N21-N26; such boxes help to indicate correspondences between the FETs in FIG. 2C and the FETs in FIG. 2D. XNR circuit 220C includes: a latch 224(2) coupled between an inverter 222(5) and an inverter 222(6); and an inverter 222(5).

Inverter 222(4) includes P21 and N21 coupled in series between VDD, i.e., node 226(1), and VSS, i.e., node 226(2). Inverter 222(5) is configured to receive a pin-signal A1 and generate a signal a1*b* on a node nd22, where (again) signal a1*b* is an inversion of pin-signal A1, and where (again) signal a1*b* is an internal signal relative to XNR circuit 220C.

Inverter 222(5) includes P22 and N22 coupled in series between VDD and VSS. Inverter 222(5) is configured to receive a pin-signal A2 and generate a signal a2*b* on a node nd21, where (again) signal a2*b* is an inversion of pin-signal A2, and where (again) signal a2*b* is an internal signal relative to XNR circuit 220C. Accordingly, pin-signal A2 is an input to XNR circuit 220C.

In FIG. 2C, inverter 222(6) includes P26 and N26 coupled in series between VDD and VSS. Inverter 222(6) is configured to receive an internal signal IS2 on a node nd23 and generate a signal Zb, where signal Z is an inversion of signal IS2, and where signal Zb represents an output of XNR circuit 220C.

Latch 224(2) is coupled between nodes nd21 and nd23. Latch 224(2) includes a 3S-INV circuit 206C and a transmission gate 230(2) coupled in parallel between nodes nd21 and nd23.

Transmission gate 230(2) is coupled between nodes nd21 and nd23; as such, nodes nd21 and nd23 correspondingly represent the input and output of transmission gate 230(1). Transmission gate 230(1) includes P23 and N23 coupled in parallel between nodes nd21 and nd23. A control terminal, i.e., the gate terminal, of P23 is configured to receive signal a1*b*. A control terminal, i.e., the gate terminal, of N23 is configured to receive pin-signal A1.

In FIG. 2C, 3S-INV circuit 206C is coupled between nodes nd21 and nd23; as such, nodes nd21 and nd23 correspondingly represent the input and output of 3S-INV 206C. 3S-INV circuit 206C includes three FETs and so is referred to herein as 3T3S-INV circuit 206C. 3T3S-INV circuit 206C includes P24 and N24-N25 coupled in series between VDD and an NRV signal, where the NRV signal is signal a1*b* in the example of FIG. 2C. P24 is coupled between VDD and a node n23. N25 is coupled between node nd23 and a node nd24. N25 is coupled between node nd24 and the NRV signal, i.e., is coupled between node nd24 and signal a1*b*. The drain of N25 is coupled to node nd24. The source of N25 is coupled to the NRV signal, i.e., to signal a1*b*. A control terminal, i.e., the gate terminal, of each of P24 and N24 is configured to receive signal a2*b*. A control terminal, i.e., the gate terminal, of N25 is configured to receive signal a1*b*.

Consider another approach for producing a three-state inverter that is a counterpart to 3T3S-INV 206C. The counterpart three-state inverter has four FETs instead of three FETs, and is referred to herein as a third counterpart 4T3S-inverter. third counterpart The third counterpart 4T3S-inverter includes a first PFET which is coupled between VDD and a second PFET, the second PFET being a counterpart to P24, a first NFET which is a counterpart to N24, and a second NFET which is a counterpart to N25. A control terminal, i.e., the gate terminal, of each of the counterpart first PFET and the counterpart second NFET is configured to receive a counterpart of internal signal a2*b*. A control terminal, i.e., the gate terminal, of the counterpart second PFET is configured to receive a counterpart of internal signal a1*b*. A control terminal, i.e., the gate terminal, of the counterpart first NFET is configured to receive a counterpart of pin-signal A1.

Due to the effect on gate capacitance induced by a pin-signal as contrasted with an internal signal, the other approach's first NFET experiences a relatively larger gate capacitance than the gate capacitances experienced by the counterpart first PFET, the counterpart second PFET and the counterpart second NFET. As such, the switching speed of the other approach's first NFET is relatively slower than the switching speed of at least the counterpart second NFET, which slows down operating speed of the other approach's second 4T3S-inverter. By contrast, the gate terminals of each of P24 and N24-N25 of 3T3S-INV circuit 206C are coupled to internal signals such that none of the gate terminals of the FETs in 3T3S-INV circuit 206C is coupled to a pin-signal. Accordingly, by avoiding having an FET whose gate terminal is coupled to a pin-signal, e.g., by not including the other approach's first NFET, the FETs of 3T3S-INV circuit 206C experiences relatively lower gate capacitances which increases the operating speed of 3T3S-INV circuit 206C as compared to the operating speed of the other approach's second 4T3S-inverter.

Consider another approach for producing an XNR circuit that is a counterpart to XNR circuit 220C and that includes the other approach's second 4T3S-inverter. The relatively slower operating speed of the other approach's second 4T3S-inverter contributes to a relatively slower operating speed of the counterpart XNR circuit. By contrast, the relatively faster operating speed of 3T3S-INV circuit 206C contributes to a relatively faster operating speed of XNR circuit 220C as compared to the operating speed of the counterpart XNR circuit.

Figure 2D:
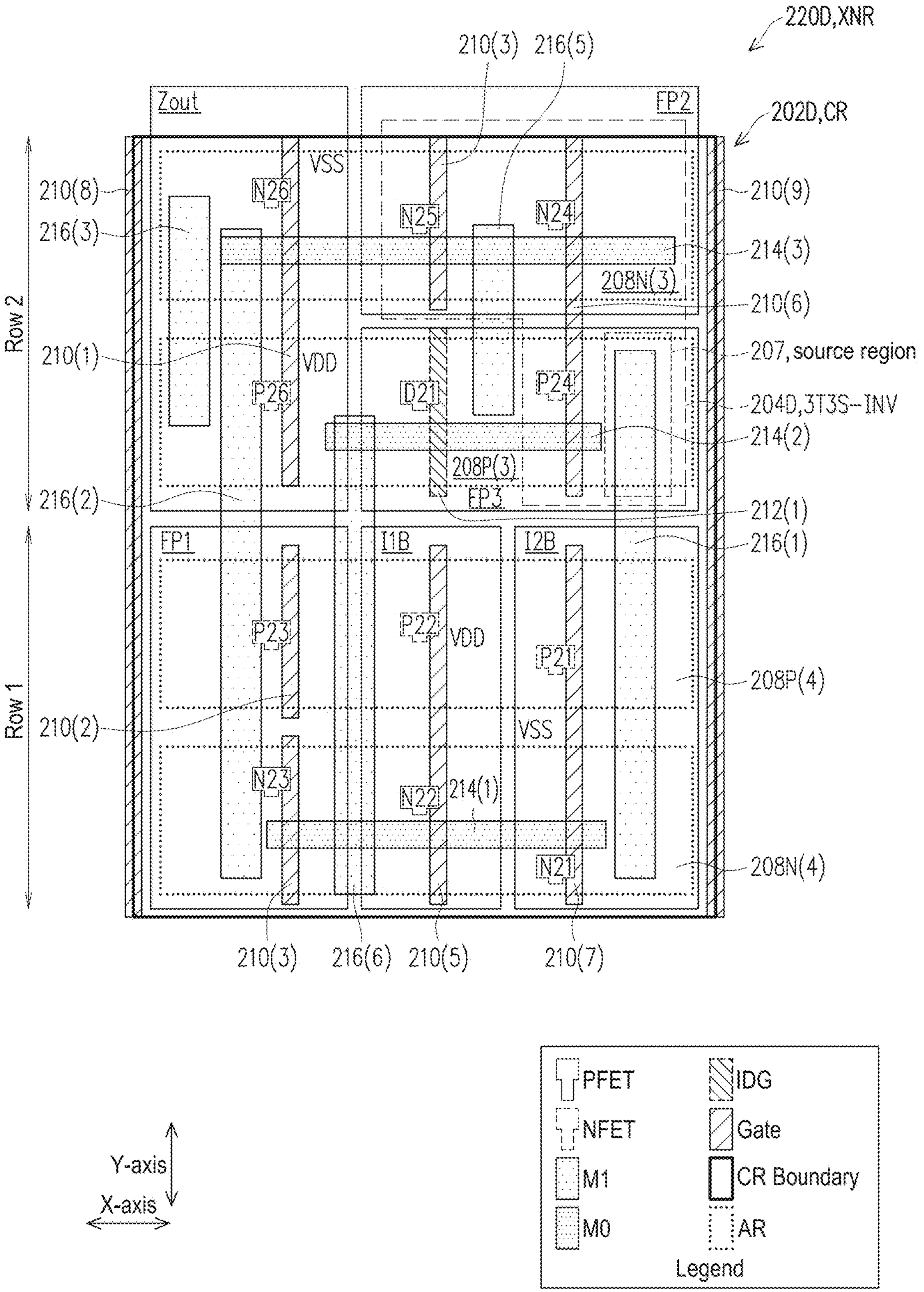

FIG. 2D is a layout diagram of a functional cell region 202D, in accordance with some embodiments.

Cell region 202D is an example of functional cell region 102 of FIG. 1. Cell region 202D is similar to cell region 202B of FIG. 2B. For purposes of brevity, the discussion will focus on differences of each of cell region 202D as compared to cell region 202B rather than on similarities.

Components included in cell region 202D include: p-type active regions (ARs) 208P(3)-208P(4) that are used for corresponding PFETs; n-type ARs 208N(3)-208N(4) that are used for corresponding NFETs; gate segments 210(1)-210(9); IDG 212(1); M0 segments 214(1)-214(3); and M1 segments 216(1)-216(3) and 216(5)-216(7). In contrast to cell region 202B of FIG. 2B, cell region 202D of FIG. 2D does not include M0 segment 214(4). Also, M1 segment 216(6) of cell region 202D replaces M1 segment 216(4) of cell region 202B of FIG. 2B.

In FIG. 2D, boxes I2B, I1B, FP1, FP2, FP3 and Zout overlap corresponding ones of P21-P24, P26 and N21-N26; such boxes help to indicate correspondences between the FETs in FIG. 2D and the FETs in FIG. 2C.

The function of cell region 202D is that of an XNR circuit. As such, cell region 202D is an example of XNR circuit 220C of FIG. 2C. Accordingly, cell region 202D is also referred to herein as XNR circuit 218B.

Relative to the Y-axis: ARs 208P(3) and 208P(4) are between ARs 208N(3) and 208N(4); AR 208P(3) is between AR 208N(3) and AR 208P(4); and AR 208P(4) is between AR 208P(3) and AR 208N(4). AR 208N(3) and AR 208P(3) are in row 1. AR 208P(4) and AR 208N(4) are in row 2.

In FIG. 2D, relative to the X-axis, adjacent ones of gate segments 210(1)-210(9) are separated from each other by distance/pitch, p_gate. In the example of FIG. 2D, relative to the X-axis, a width of cell region 202D, w_202D, is equal to 4*p_gate such that w_202D=(4*p_gate). In some embodiments, a width of a cell region, w_CR, is different than w_202D.

In FIG. 2D, N24-N26 are formed in AR 208N(3). P24, P26 and a dummy FET D21 are formed in AR 208P(3). Dummy D21 includes IDG 212(1) in place of a corresponding gate segment, hence D21 is a dummy FET and not a PFET. P21-P23 are formed in AR 208P(4). N21-N23 are formed in AR 208N(4).

Gate segment 210(7) is over each of the AR 208P(4) and AR 208N(4) and is configured to receive pin-signal A1. Gate segment 210(6) is over AR 208P(3) and AR 208N(3), is configured to receive signal a2*b*, and is substantially collinear with gate segment 210(7).

Regarding first S/D regions in 208P(4) and 208N(4) that are adjacent the right side of gate segment 210(7), the first S/D regions are coupled together and are configured to provide signal a1*b*.

Regarding a first S/D region in 208P(3) that is adjacent the right side of gate segment 210(6), the first S/D region is configured to receive signal a1*b*. Regarding second S/D regions in each of AR 208P(4) and AR 208N(4) adjacent the left side of the first gate segment 210(7) correspondingly being configured to receive VDD and VSS.

Regarding a first S/D region in the AR 208P(3) that is adjacent the right side of gate segment 210(6), the first S/D region is configured to receive a non-reference-voltage (NRV) signal, where the NRV signal is internal signal a1*b* in the example of FIG. 2D. Further regarding the first S/D region in the AR 208P(3), the first S/D region functions as a source region of P24, and is allotted reference number 207 in FIG. 2D. Together, P24 and N24-N25 comprise 3T3S-INV 204D in FIG. 2D, where 3T3S-INV 204D of FIG. 2D corresponds to 3T3S-INV 204C of FIG. 2C.

Gate segment 210(5) is over each of AR 208P(4) and AR 208N(4) and is configured to receive pin-signal A2. Second S/D regions in AR 208P(4) and AR 208N(4) also are adjacent the right side of gate segment 210(5). Third S/D regions in the AR 208P(4) and AR 208N(4) are adjacent the left side of gate segment 210(5), are coupled together, and are configured to provide signal a2*b*.

Gate segment 210(2) is over the AR 208P(4) and is configured to receive signal a1*b*. Gate segment 210(3) is over AR 208N(4) and is configured to receive pin-signal A1. The third S/D regions in the AR 208P(4) FIG. 2D and AR 208N(4) correspondingly also are adjacent the right side of gate segment 210(2) and gate segments 210(3). Fourth S/D regions in AR 208P(4) and AR 208N(4) correspondingly are adjacent the left side of gate segment 210(2) and gate segment 210(3), are coupled together and are configured to provide internal signal IS2.

M0 segment 214(1) overlies AR 208N(4) and each of gate segments 210(7), 210(5) and 210(3) and is coupled to each of gate segment 210(7) and 210(3). M0 segment 214(1) is free of being coupled to gate segment 210(5).

IDG 212(1) is over AR 208P(3) and substantially collinear with gate segments 210(3) and 210(5). The right side of IDG 212(1) is adjacent to the left side of gate segment 210(6). A second S/D region in the AR 208P(3) is adjacent the right side of IDG 212(1). A third S/D region in AR 208P(3) is adjacent the left side of IDG 212(1) and is configured to receive signal a2*b*.

FIGS. 3A-3B are corresponding cross-sections 328A-328B of an XOR circuit, in accordance with some embodiments.

In some embodiments, the XOR circuit corresponding to cross-sections 328A-328B is an example of XOR circuit 202B of FIG. 2B. Cross-section 328A of FIG. 3A corresponds to section line 3A-3A' of FIG. 2B. Cross-section 328B of FIG. 3B corresponds to section line 3B-3B' of FIG. 2B.

Structures in FIGS. 3A and/or 3B include: a substrate; ARs 308P(2) and 308N(1)-308N(2); gate segments 310(3), 310(5) and 310(7); metal-to-source/drain contact (MD) structures; via-to-gate (VG) contacts; via-to-MD (VD) contacts; a VD rail (VDR) contact; M0 segments 314(1) and 314(5)-314(6); V0 structures; and M1 segment 316(1).

VD contacts are generally square such that all boundary sides are substantially the same length. An instance of a VD contact in which the left and right boundary sides are substantially longer the upper and lower boundary sides, or vice-versa, i.e., an instance of a VD contact that is substantially rectangular, referred to as VD rail (VDR) contact.

Figure 4A:
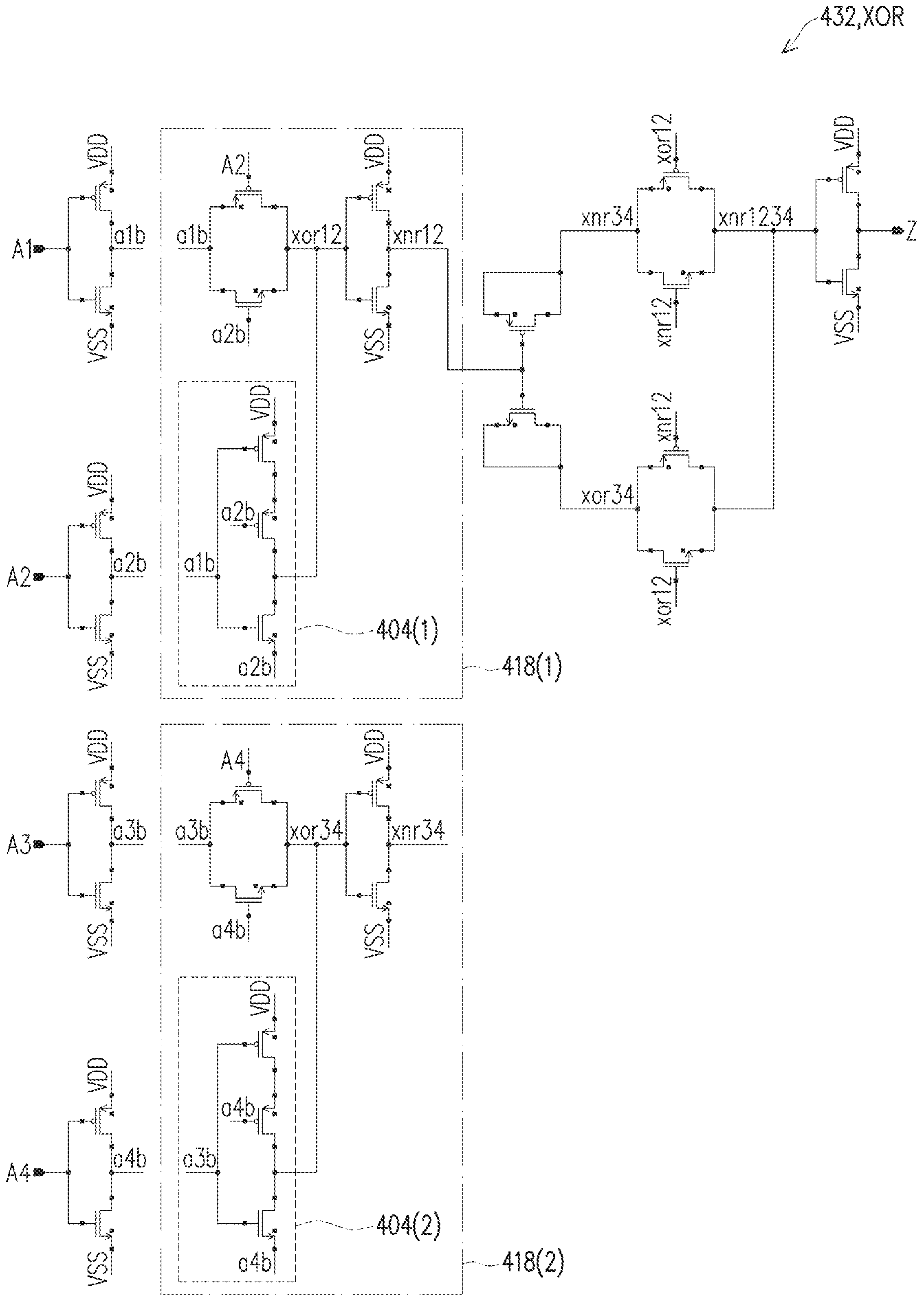
FIGS. 4A-4B are corresponding circuit schematic diagrams, in accordance with some embodiments.

FIG. 4A is a circuit schematic diagram of an XOR circuit 432, in accordance with some embodiments.

XOR circuit 432 is a four input XOR circuit. XOR circuit 432 includes two XOR circuits 418(1) and 418(2). In some embodiments, each of XOR circuits 418(1) and 418(2) is an instance of XOR circuit 218A of FIG. 2A. As such, each of XOR circuits 418(1) and 418(2) is a two input XOR. Among other things, XOR circuit 418(1) includes a 3S-INV 404(1). Among other things, circuit 418(2) includes a 3S-INV 404(2). Coupling together XOR circuits 418(1) and 418(2) as in FIG. 4A results in XOR circuit 342 being a four input XOR circuit.

Signals in XOR circuit 432 include: pin-signals A1, A2, A3 and A4 and corresponding inversions thereof a1*b*, a2*b*, a3*b* and a4*b*, where signals a1*b*-a4*b* are internal signals; internal signals xor12, xor34, xnr12 and xnr34; and output signal Z.

Figure 4B:
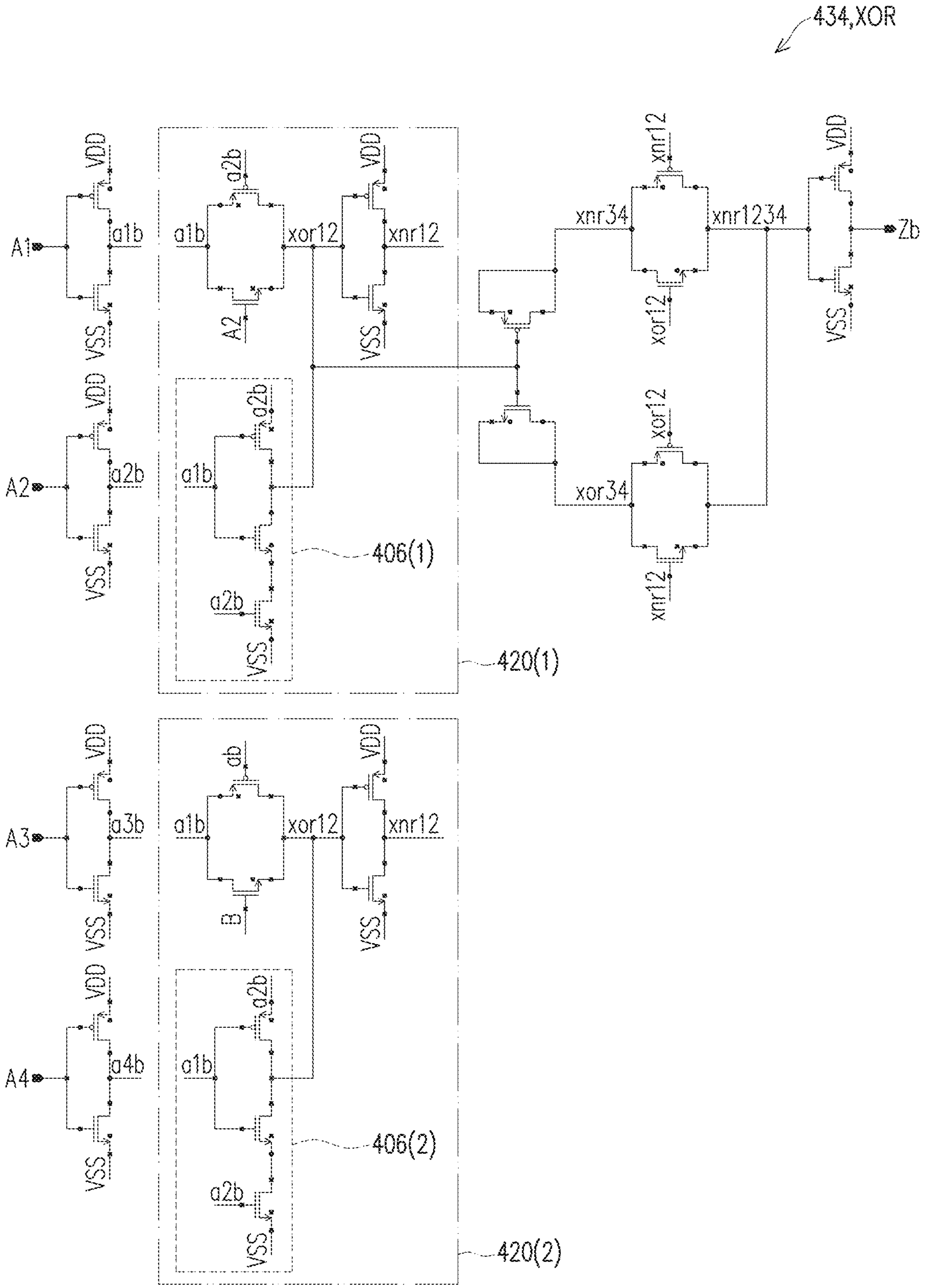

FIG. 4B is a circuit schematic diagram of an XNR circuit 4434, in accordance with some embodiments.

XNR circuit 434 is a four input XNR circuit. XNR circuit 434 includes two XNR circuits 420(1) and 420(2). In some embodiments, each of XNR circuits 420(1) and 420(2) is an instance of XNR circuit 220C of FIG. 2C. As such, each of XNR circuits 420(1) and 420(2) is a two input XNR. Among other things, XOR circuit 418(1) includes a 3S-INV 404(1).

Among other things, circuit 418(2) includes a 3S-INV 404(2). Coupling together XNR circuits 420(1) and 420(2) as in FIG. 4B results in XNR circuit 434 being a four input XNR circuit.

Signals in XNR circuit 434 include: pin-signals A1, A2, A3 and A4 and corresponding inversions thereof a1*b*, a2*b*, a3*b* and a4*b*, where signals a1*b*-a4*b* are internal signals; internal signals xor12, xor34, xnr12 and xnr34; and output signal Z.

Figure 4C:
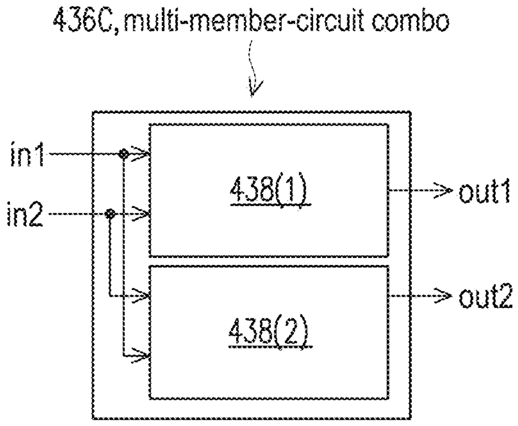
FIGS. 4C-4E are corresponding block diagrams, in accordance with some embodiments.
Figure 4D:
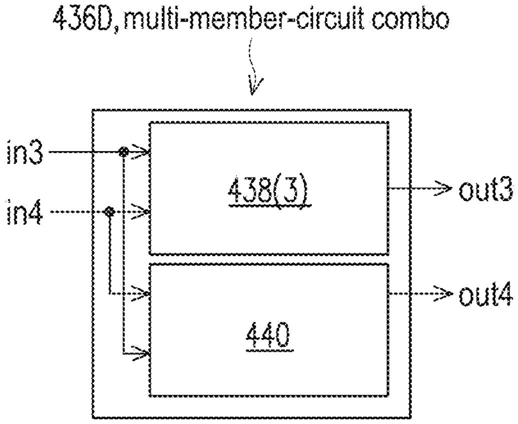
Figure 4E:
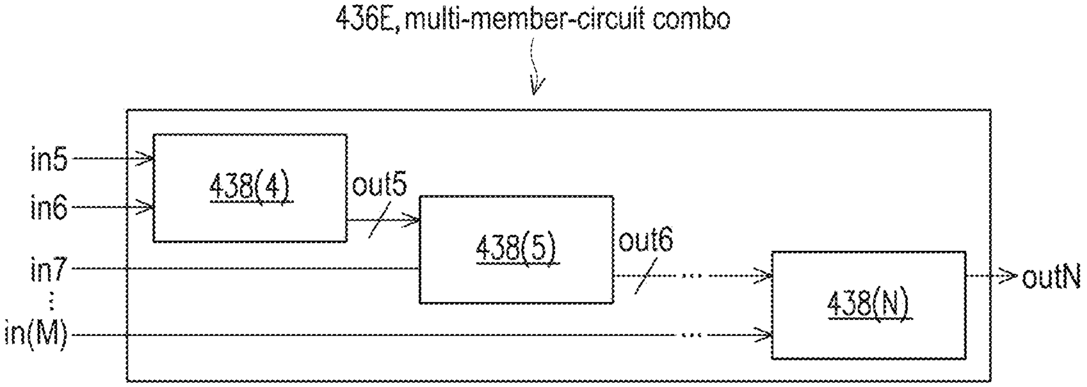

FIGS. 4C-4E are block diagrams of corresponding multi-member-circuit (MMC) combinations 436C-436E, in accordance with some embodiments.

In FIG. 4C, MMC combination (MMC combo) 436C includes a member-circuit 438(1) and a member circuit 438(2). Member-circuits 438(1)-438(2) are coupled in parallel to input signals in1 and in2.

Member-circuit 438(1) is based on 3T3S-INV 204A of FIG. 2A or 3T3S-INV 206C of FIG. 2C and is configured to perform a first function which generates an output signal in1. Member-circuit 438(2) is based on 3T3S-INV 204A of FIG. 2A or 3T3S-INV 206C of FIG. 2C and is configured to perform a second function which generates an output signal in2, the second function being different than the first function.

In FIG. 4D, MMC combo 436D includes a member-circuit 438(3) and a member circuit 440. Member-circuits 438(3) and 440 are coupled in parallel to input signals in3 and in4.

Member-circuit 438(3) is based on 3T3S-INV 204A of FIG. 2A or 3T3S-INV 206C of FIG. 2C and is configured to perform a third function which generates an output signal in3. Member-circuit 440(2) is based on the other approach's first 4T3S-inverter or the other approach's second 4T3S-inverter and is configured to perform a fourth function which generates an output signal in4, the fourth function being different than the third function.

In FIG. 4E, MMC combo 436E includes member-circuits 438(4), 438(5), . . . and 438(N), where N is a positive integer and 3≤N. MMC combo 436E is coupled to input signals in5, in6, in7. . . and in(M), where M is a positive integer and 5≤N. In some embodiments, N=M+1.

Each of member-circuits 438(4)-438(N) is based correspondingly on 3T3S-INV 204A of FIG. 2A or 3T3S-INV 206C of FIG. 2C. Member-circuits 438(4)-438(N) are configured to perform functions which generate corresponding output signals out5-outN. In some embodiments, each of member-circuits 438(4)-438(N) is configured to perform the same function. In some embodiments, at least one of member-circuits 438(4)-438(N) is configured to perform a function that is different than a function which another at least one of member-circuits 438(4)-438(N) is configured to perform.

Figure 5A:
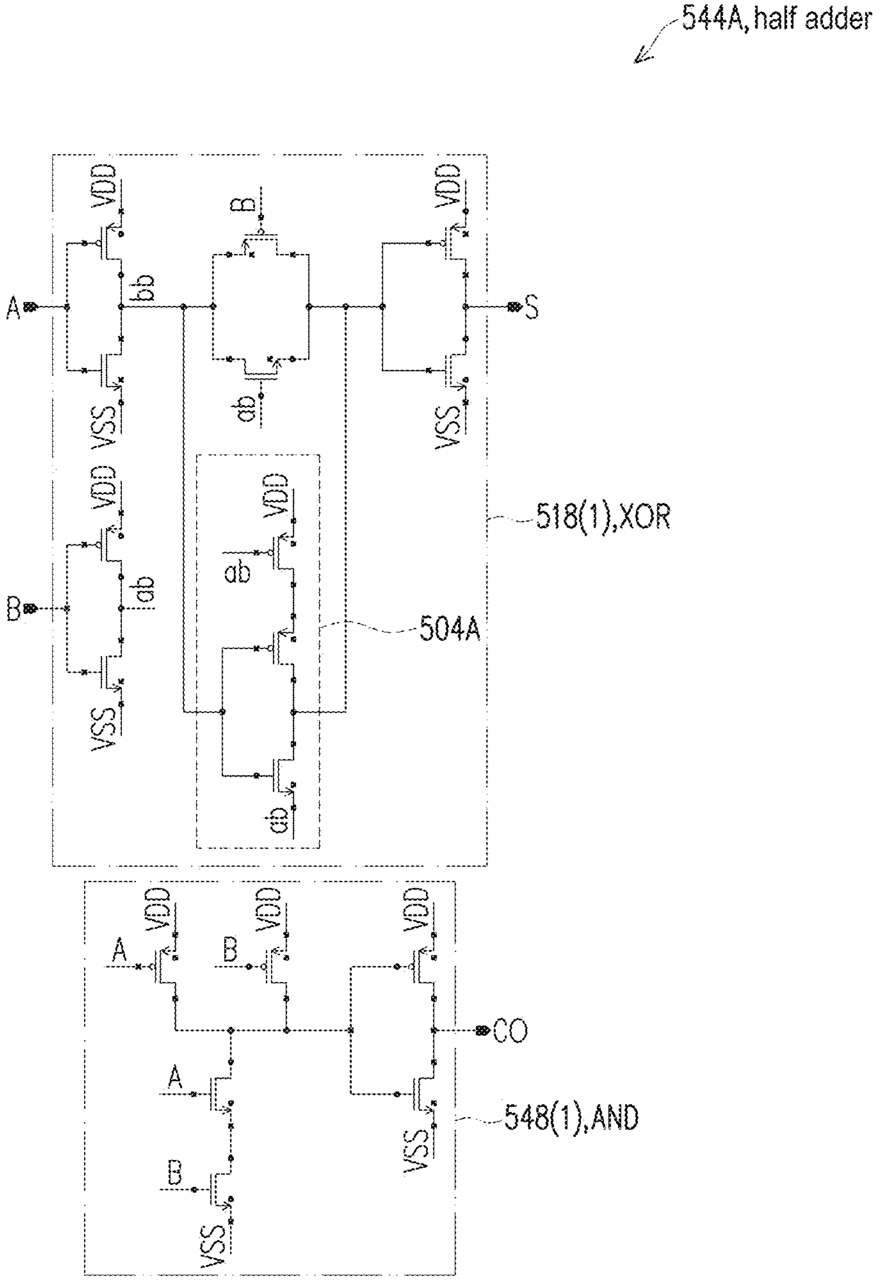
FIGS. 5A, 5C, 5E and 5G are corresponding circuit schematic diagrams, in accordance with some embodiments.

FIG. 5A is a circuit schematic diagram of a half adder 544A, in accordance with some embodiments.

Half adder 544A includes an XOR circuit 518(1) and a logical AND circuit 548(1). In some embodiments, XOR circuit 518(1) is an instance of XOR circuit 218A of FIG. 2A. XOR circuit 518(1) includes a 3T3S-INV 504A. In some embodiments, 3T3S-INV 504A is an instance of 3T3S-INV 204A of FIG. 2A. Signals in half adder 544A include: pin-signals A and B and corresponding inversions thereof ab and bb, where signals ab and bb are internal signals; and output signals S and CO.

Figure 5B:
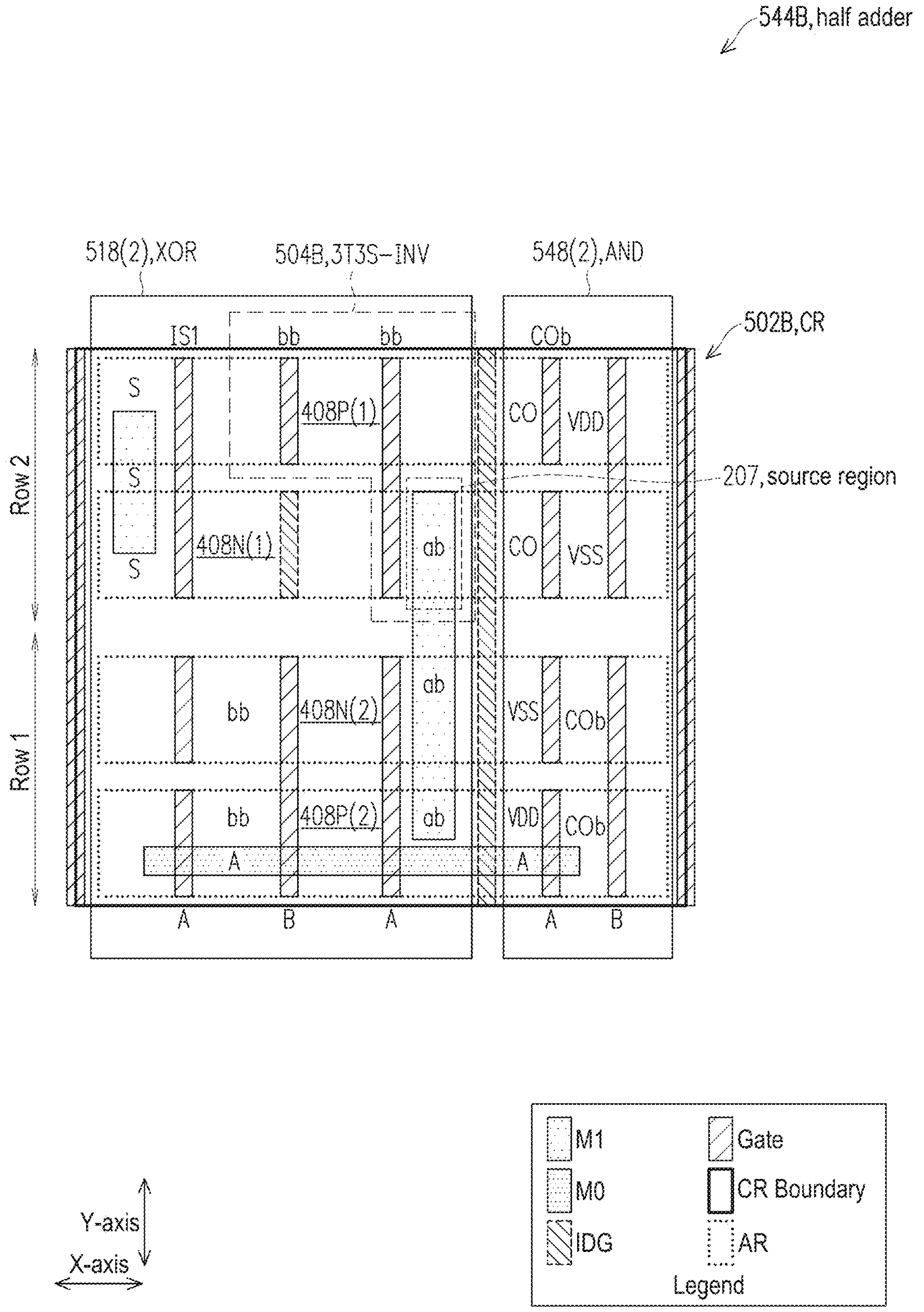
FIGS. 5B, 5D, 5F and 5H are corresponding layout diagrams, in accordance with some embodiments.

FIG. 5B is a layout diagram of a functional cell region 502B, in accordance with some embodiments.

Cell region 502B is an example of functional cell region 102 of FIG. 1. Cell region 502B is a part of, i.e., comprises, a larger region 544B, where the function of larger region 544B is that of a half adder. As such, larger region 544B is an example of half adder 544A of FIG. 5A. Accordingly, larger region 544B is referred to herein as half adder 544B.

Cell region 502B includes a region 518(2) and a region 548(2). The function of region 518(2) is that of an XOR circuit. Accordingly, region 518(2) is referred to herein as XOR circuit 518(2). The function of region 548(2) is that of a logical AND circuit. Accordingly, region 548(2) is referred to herein as AND circuit 548(2). In some embodiments, XOR circuit 518(2) is an example of XOR circuit 518(1) of FIG. 5A. In some embodiments, AND circuit 548(2) is an example of AND circuit 548(1) of FIG. 5A.

XOR circuit 518(2) includes a region 504B. The function of region 504B is that of a 3T3S-INV. Accordingly, region 504B is referred to as 3T3S-INV 504B. In some embodiments, 3T3S-INV 504B is an example of 3T3S-INV 504A of FIG. 5A.

Signals in half adder 544A include: pin-signals A and B and corresponding inversions thereof ab and bb, where signals ab and bb are internal signals; an internal signal COb (not shown) which is an inversion of output signal CO; and output signals S and CO.

Figure 5C:
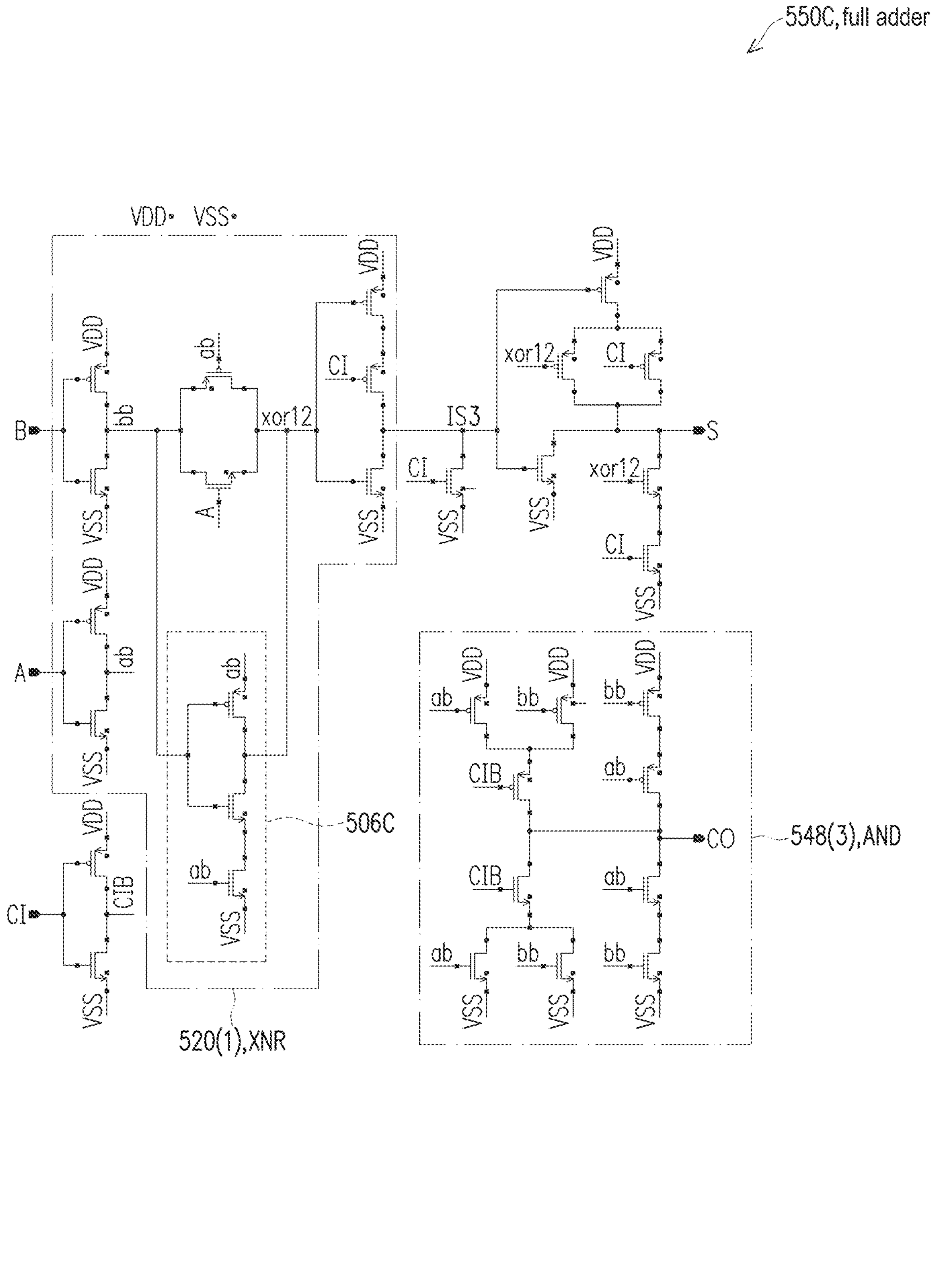

FIG. 5C is a circuit schematic diagram of a full adder 550C, in accordance with some embodiments.

Full adder 550C includes an XNR circuit 520(1) and a logical AND circuit 548(3). In some embodiments, XNR circuit 520(1) is an example of XNR circuit 220C of FIG. 2C. XNR circuit 520(1) includes a 3T3S-INV 506C. In some embodiments, 3T3S-INV 506C is an instance of 3T3S-INV 204A of FIG. 2A. Signals in full adder 550C include: pin-signals A, B, CI and corresponding inversions thereof ab, bb and CIb, where signals ab, bb and CIb are internal signals; and output signals S and CO.

Figure 5D:
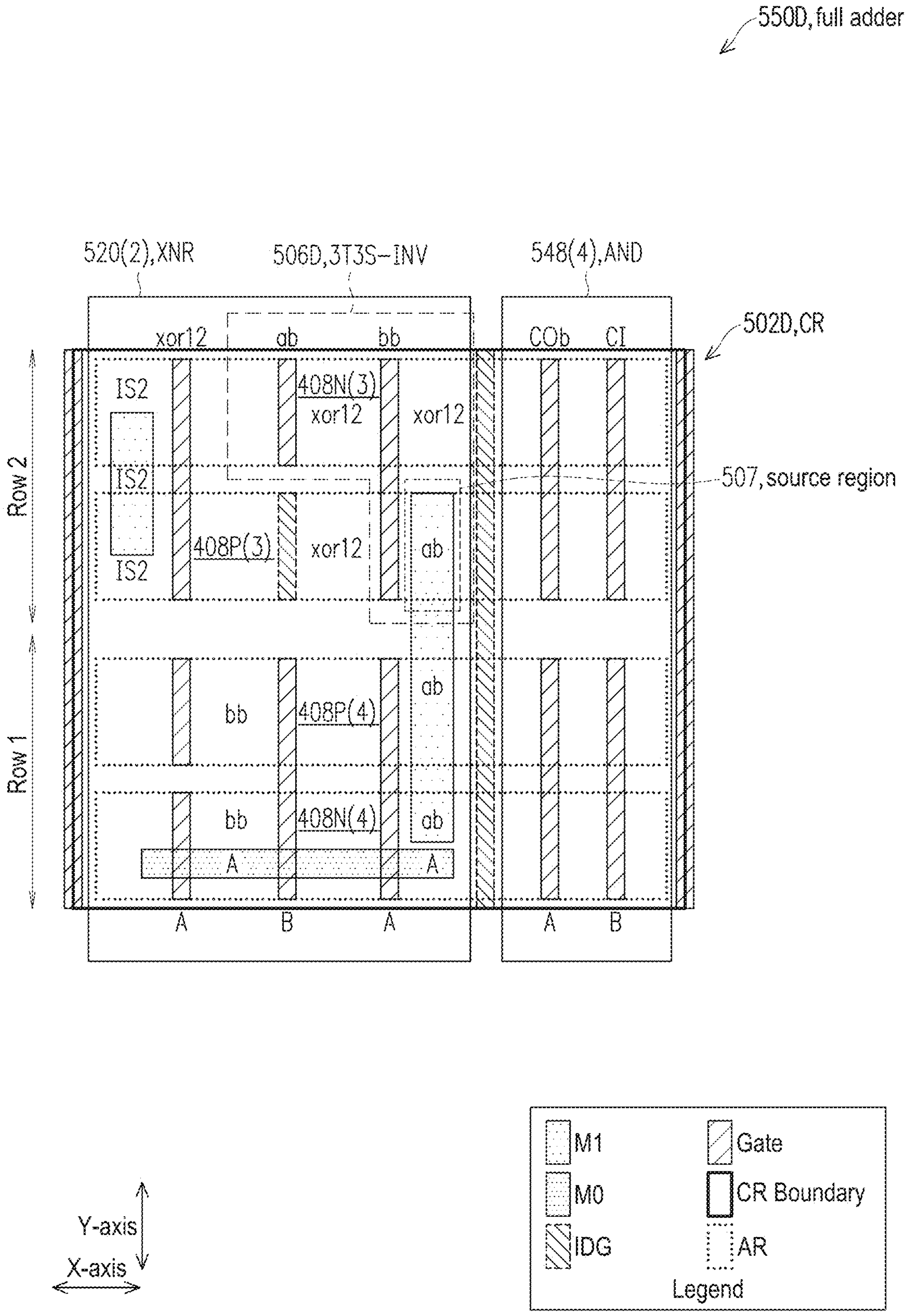

FIG. 5D is a layout diagram of a functional cell region 502D, in accordance with some embodiments.

Cell region 502D is an example of functional cell region 102 of FIG. 1. Cell region 502D is a part of, i.e., comprises, a larger region 550D, where the function of larger region 550D is that of a full adder. As such, larger region 544D is an example of adder 550C of FIG. 5C. Accordingly, larger region 550D is referred to herein as full adder 550D.

Cell region 502D includes a region 520(2) and a region 548(4). The function of region 520(2) is that of an XNR circuit. Accordingly, region 520(2) is referred to herein as XNR circuit 520(2). The function of region 548(4) is that of a logical AND circuit. Accordingly, region 548(4) is referred to herein as AND circuit 548(4). In some embodiments, XOR circuit 520(2) is an example of XNR circuit 520(1) of FIG. 5C. In some embodiments, AND circuit 548(4) is an example of AND circuit 548(3) of FIG. 5C.

XNR circuit 520(2) includes a region 506D. The function of region 506D is that of a 3T3S-INV. Accordingly, region 506D is referred to as 3T3S-INV 506D. In some embodiments, 3T3S-INV 506D is an example of 3T3S-INV 506C of FIG. 5C.

Signals in full adder 550C include: pin-signals A and B and corresponding inversions thereof ab and bb, where signals ab and bb are internal signals; a pin-signal CI; internal signals xor12 and IS3; an internal signal COb (not shown) which is an inversion of output signal CO; and output signals S and CO.

Figure 5E:
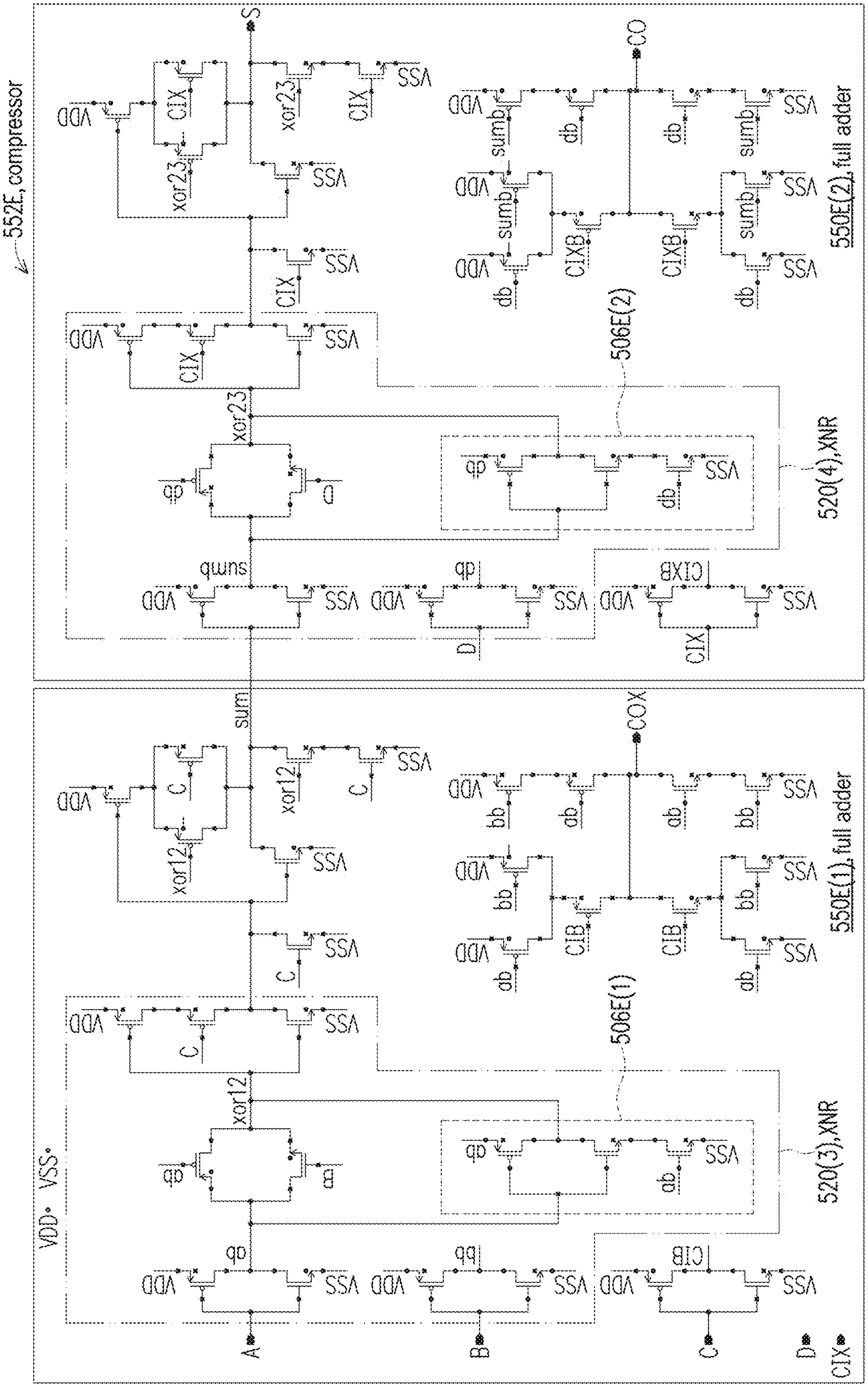

FIG. 5E is a circuit schematic diagram of a compressor 552E, in accordance with some embodiments.

Compressor 552E includes a full adder 550(1) and a full adder 550(2). Full adder 550E(1) includes an XNR circuit 520(3). In some embodiments, XNR circuit 520(3) is an instance of XNR circuit 220C of FIG. 2C. XNR circuit 520(3) includes a 3T3S-INV 506E(1). In some embodiments, 3T3S-INV 506E(1) is an instance of 3T3S-INV 206C of FIG. 2C. Full adder 550E(2) includes an XNR circuit 520(4). In some embodiments, XNR circuit 520(4) is an instance of XNR circuit 220C of FIG. 2C. XNR circuit 520(4) includes a 3T3S-INV 506E(2). In some embodiments, 3T3S-INV 506E(2) is an instance of 3T3S-INV 206C of FIG. 2C.

Signals in compressor 552E include: pin-signals A, B, C and D and corresponding inversions thereof ab, bb, CIB and db, where signals ab, bb, CIB and db are internal signals; a pin-signal CIX and an inversion thereof CIXB, where signal CIXB is an internal signal; internal signals xor12, sum, sumb, xor23; an internal signal Sb (not shown) which is an inversion of output signal S; and output signals S and CO.

Figure 5F:
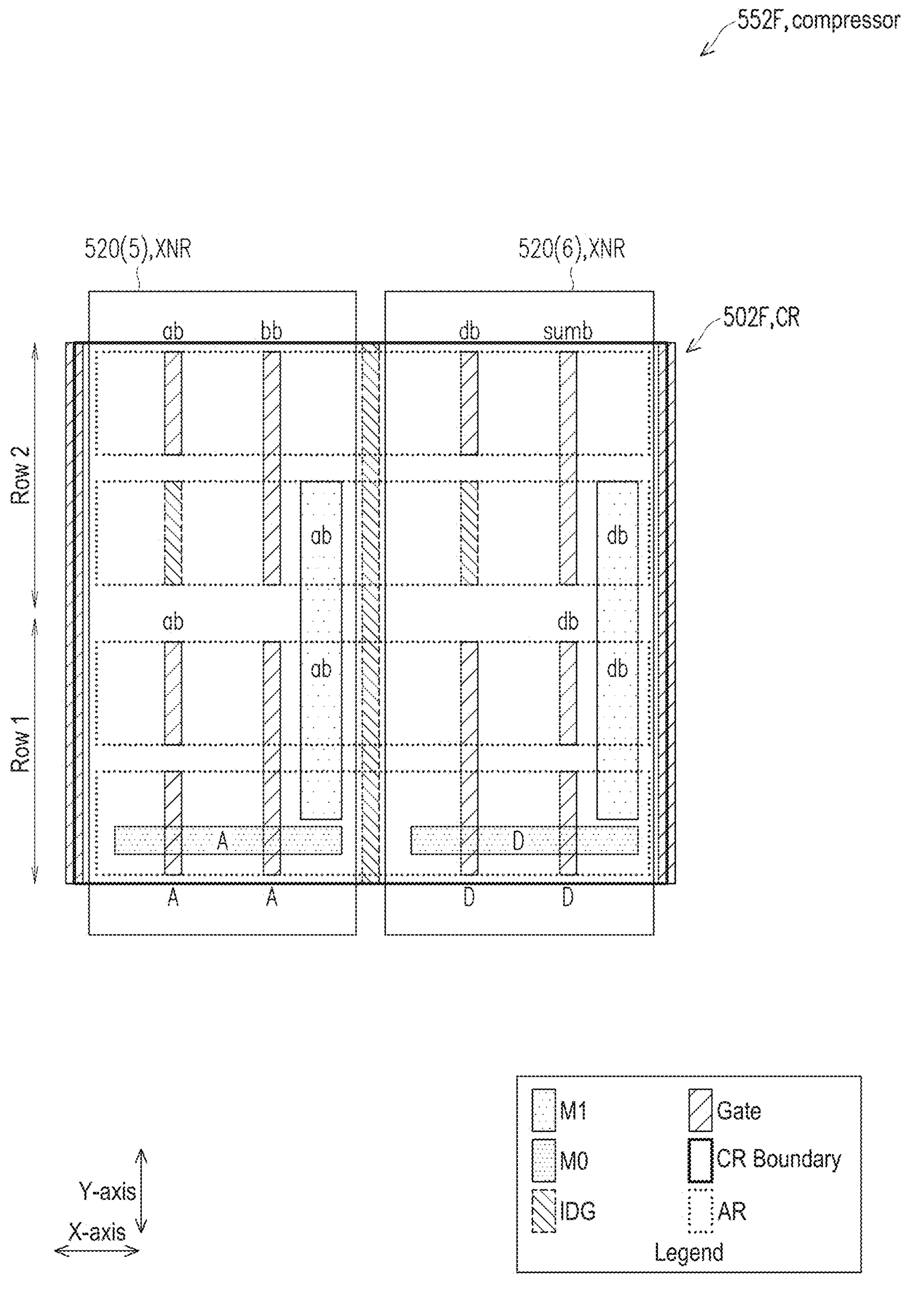

FIG. 5F is a layout diagram of a functional cell region 502F, in accordance with some embodiments.

Cell region 502F is an example of functional cell region 102 of FIG. 1. Cell region 502F is a part of, i.e., comprises, a larger region 552F, where the function of larger region 552F is that of a compressor. As such, larger region 552F is an example of compressor 552E of FIG. 5E. Accordingly, larger region 552F is referred to herein as compressor 552F.

Cell region 502F includes a region 520(5) and a region 520(6). The function of region 520(5) is that of an XNR circuit. Accordingly, region 520(5) is referred to herein as XNR circuit 520(2). The function of region 520(6) is that of an XNR circuit. Accordingly, region 520(6) is referred to herein as XNR circuit 520(6). In some embodiments, XOR circuit 520(5) is an example of XNR circuit 520(3) of FIG. 5E. In some embodiments, XOR circuit 520(6) is an example of XNR circuit 520(4) of FIG. 5C.

Signals in compressor 552F include: pin-signals A and D and corresponding inversions thereof ab and db, where signals ab and db are internal signals; an internal signal bb which is an inversion of a pin-signal B (not shown); and an internal signal sumb.

Figure 5G:
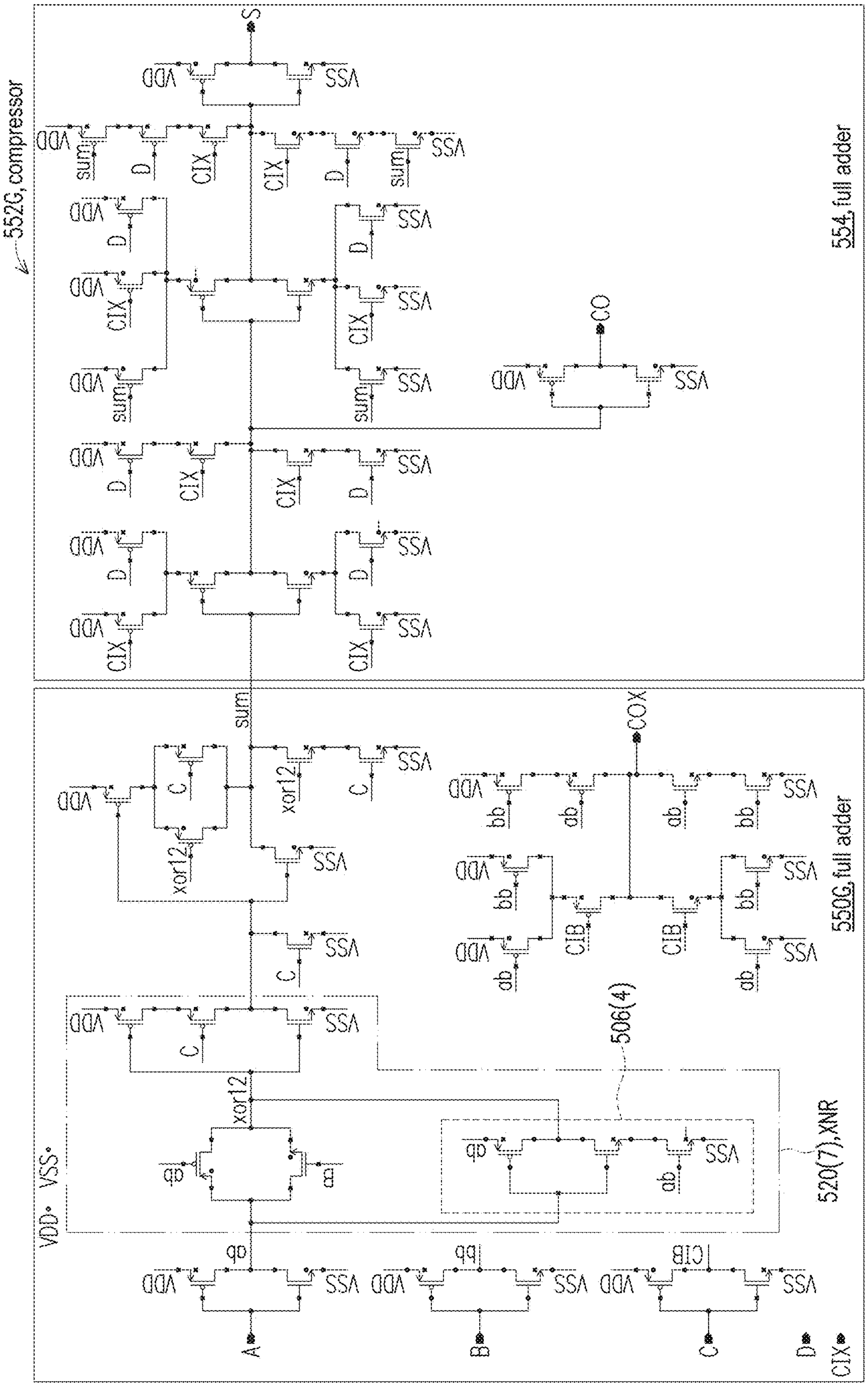

FIG. 5G is a circuit schematic diagram of a compressor 552G, in accordance with some embodiments.

Compressor 552G includes a full adder 550G and a full adder 554. Full adder 550G includes an XNR circuit 520(7). In some embodiments, XNR circuit 520(7) is an instance of XNR circuit 220C of FIG. 2C. XNR circuit 520(7) includes a 3T3S-INV 506(4). In some embodiments, 3T3S-INV 506(4) is an instance of 3T3S-INV 206C of FIG. 2C. Full adder 554 is based on the other approach's first 4T3S-inverter or the other approach's second 4T3S-inverter.

Signals in compressor 552G include: pin-signals A, B, C and D and corresponding inversions thereof ab, bb, CIB and db, where signals ab, bb, CIB and db are internal signals; a pin-signal; internal signals xor12 and sum; an internal signal Sb (not shown) which is an inversion of output signal S; and output signals S and CO.

Figure 5H:
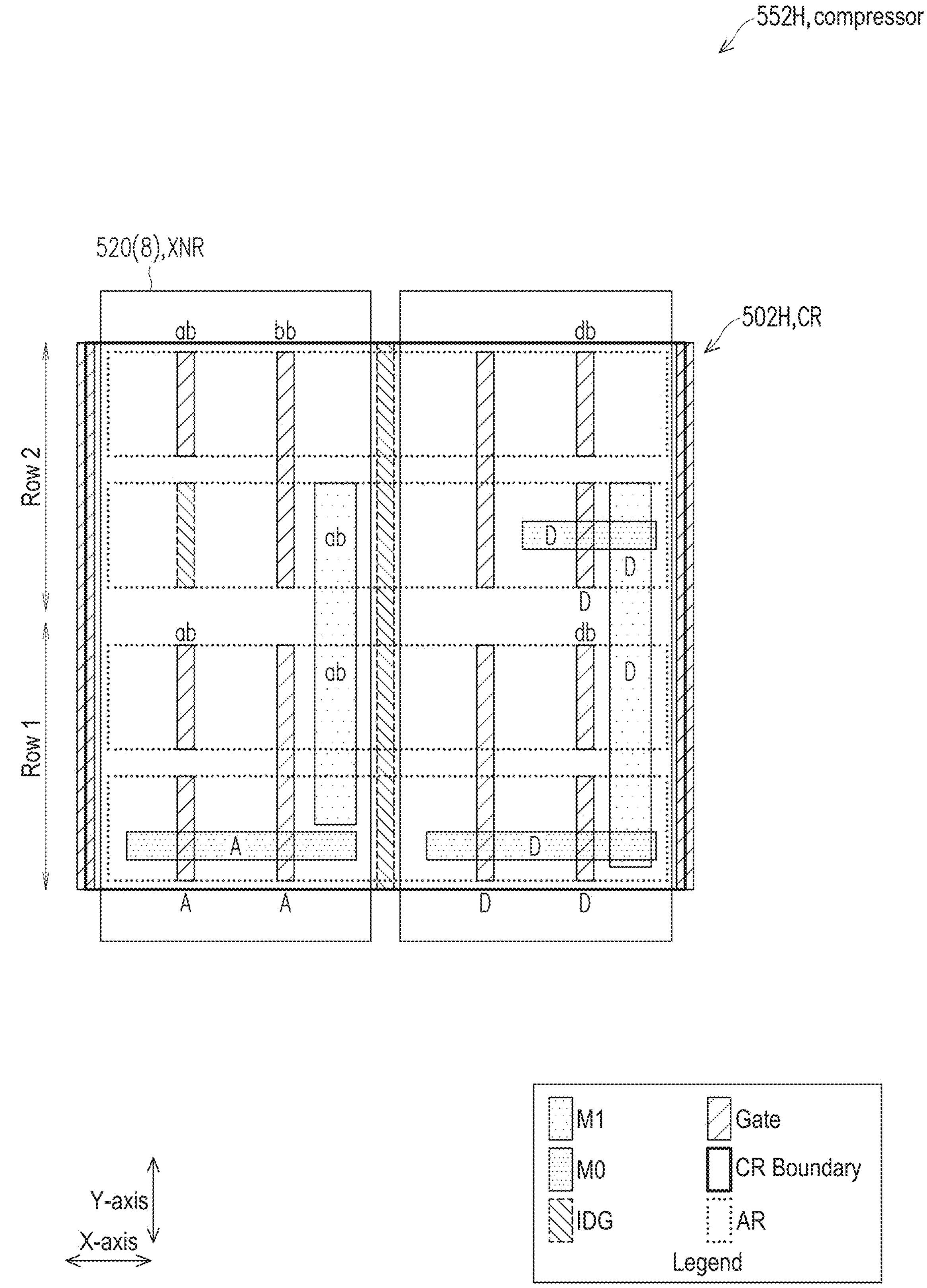

FIG. 5H is a layout diagram of a functional cell region 502H, in accordance with some embodiments.

Cell region 502H is an example of functional cell region 102 of FIG. 1. Cell region 502H is a part of, i.e., comprises, a larger region 552H, where the function of larger region 552H is that of a compressor. As such, larger region 552H is an example of compressor 552F of FIG. 5E. Accordingly, larger region 552H is referred to herein as compressor 552H.

Cell region 502H includes a region 520(8). The function of region 520(8) is that of an XNR circuit. Accordingly, region 520(7) is referred to herein as XNR circuit 520(8).

In some embodiments, XOR circuit 520(8) is an example of XNR circuit 520(7) of FIG. 5G.

Signals in compressor 552H include: pin-signals A and D and corresponding inversions thereof ab and db, where signals ab and db are internal signals; and an internal signal bb which is an inversion of a pin-signal B (not shown).

Figure 6:
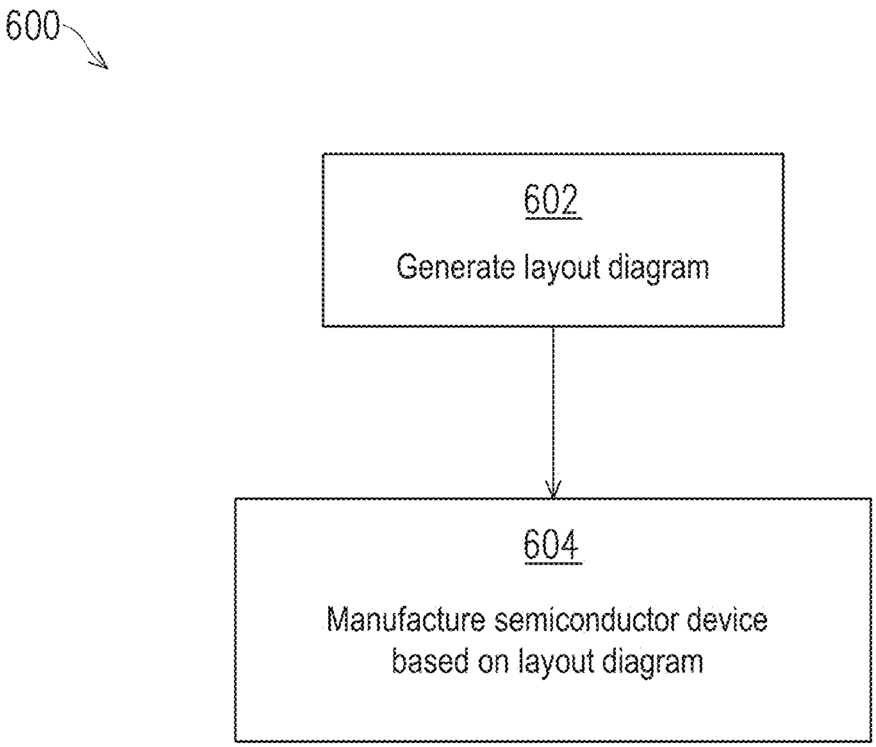
FIGS. 6 and 7 are flowcharts of corresponding methods, in accordance with some embodiments.

FIG. 6 is a flowchart (flow diagram) of a method 600 of manufacturing device, in accordance with some embodiments.

Method 600 is implementable, for example, using EDA system 800 (FIG. 8, discussed below) and an IC manufacturing system 900 (FIG. 9, discussed below), in accordance with some embodiments. Examples of cell regions and/or macro regions which can be manufactured according to method 600 include the cell regions and/or macro regions disclosed herein, or the like.

In FIG. 6, method 600 includes blocks 602-604. At block 602, a layout diagram is generated which, among other things, includes one or more layout diagrams corresponding to one or more of the circuit schematic diagrams disclosed herein, one or more layout diagrams corresponding to one or more of the cell regions herein, one or more of the macro regions disclosed herein, or the like. Block 602 is implementable, for example, using EDA system 800 (FIG. 8, discussed below), in accordance with some embodiments. From block 602, flow proceeds to block 604.

At block 604, based on the layout diagram, at least one of (A) one or more photolithographic exposures are made or (b) one or more photolithography masks are fabricated or (C) one or more components in a layer of a device, e.g., a device is fabricated. See discussion below of IC manufacturing system 900 in FIG. 9 below.

Figure 7:
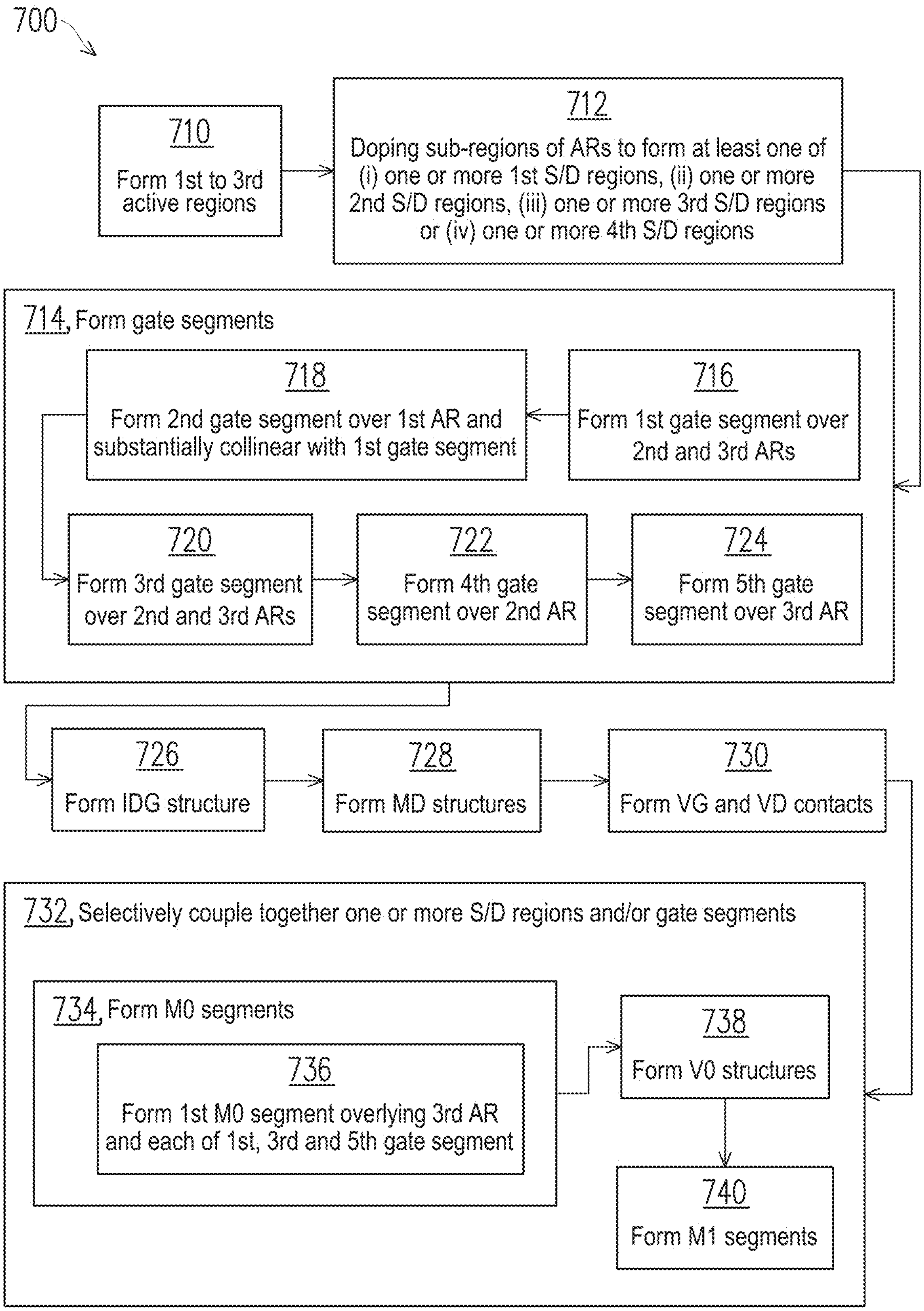

FIG. 7 is a flowchart of a method 700 of manufacturing a device, in accordance with some embodiments.

Method 700 is an example of block 604 (see FIG. 6, discussed above). Method 700 is implementable, for example, using IC manufacturing system 900 (see FIG. 9, discussed below), in accordance with some embodiments. Examples of a devices which can be manufactured according to method 700 include devices that include devices corresponding to one or more of the circuit schematic diagrams disclosed herein, one or more of cell regions disclosed herein or one or more of the macro regions disclosed herein, or the like. Method 700 includes blocks 710-738.

At block 710, first, second and third active regions (e.g., 208N(1)-208N(2) and 208P(1) of FIG. 2B; 208P(3), 208P(4) and 208N(4) of FIG. 2D; or the like) are formed extending in a first direction (e.g., parallel to the X-axis). The first and second active regions have a first conductivity type (e.g., N-type in FIG. 2B; P-type in FIG. 2D, or the like). The third active region has a second conductivity type (e.g., P-type in FIG. 2B; N-type in FIG. 2D, or the like) which is different than the first conductivity type. From block 710, flow proceeds to block 712.

At block 712, sub-regions of the ARs are doped to form at least one of ((i) one or more first S/D regions, (ii) one or more second S/D regions, (iii) one or more third S/D regions or (iv) one or more fourth S/D regions. In general, an S/D region is adjacent a left side or a right side of a corresponding gate segment (e.g., 210(1)-210(9)). Examples of each of the first to fourth S/D regions are discussed in the context of FIG. 2B, FIG. 2D, or the like. From block 712, flow proceeds to block 714.

At block 714, gate segments are formed which extend in a second direction (e.g., parallel to the Y-axis) perpendicular to the first direction. Block 712 includes blocks 716-724. Within block 714, flow proceeds to block 716.

At block 716, a first gate segment (e.g., 210(7)) is formed over the second (e.g., 208N(2) of FIG. 2B; 208P(4) of FIG. 2D; or the like) and third (e.g., 208P(2) of FIG. 2B; 208P(3), 208N(4) of FIG. 2D; or the like) active regions. From block 716, flow proceeds to block 718.

At block 718, a second gate segment (e.g., 210(6)) is formed over the first active region (e.g., 208N(1) of FIG. 2B; 208P(3) of FIG. 2D; or the like) and substantially collinear with the first gate segment (e.g., 210(7). From block 718, flow proceeds to block 720.

At block 720, a third gate segment (e.g., 210(5)) is formed over the second (e.g., 208N(2) of FIG. 2B; 208P(4) of FIG. 2D; or the like) and third (e.g., 208P(2) of FIG. 2B; 208P(3), 208N(4) of FIG. 2D; or the like) active regions. From block 720, flow proceeds to block 722.

At block 722, a fourth gate segment (e.g., 210(2)) is formed over the second active region (e.g., 208N(2) of FIG. 2B; 208P(4) of FIG. 2D; or the like). From block 722, flow proceeds to block 724.

At block 724, a fifth gate segment (e.g., 210(3)) is formed over the third active region (e.g., 208P(2) of FIG. 2B; 208P(3), 208N(4) of FIG. 2D; or the like). From block 724, flow exits block 714. From block 714, flow proceeds to block 726.

At block 726, an IDG structure (e.g., 212(1)) is formed. From block 726, flow proceeds to block 728.

At block 728, MD structures (e.g., see FIGS. 3A-3B) are formed. From block 728, flow proceeds to block 730.

At block 730, VG contacts (e.g., see FIGS. 3A-3B) and VD contacts (e.g., see FIGS. 3A-3B) are formed. From block 7230, flow proceeds to block 732.

At block 732, one or more of the S/D regions and/or one or more of the gate segments are coupled together. Examples of one or more gate segments being coupled together include: gate segments 210(3), 210(5) and 210(7) being coupled together in FIG. 2B or 2D, gate segments 210(1) and 210(6) being coupled together in FIG. 2B or 2D, or the like. Examples of one or more S/D regions being coupled together include: the first S/D regions in ARs 208N(1), 208N(2) and 208P(2) in FIG. 2B; the first S/D regions in ARs 208P(3), 208P(4) and 208N(4) in FIG. 2D; the first S/D region in AR 208P(1), the second S/D region in AR 208N(1) and the fourth S/D regions in ARs 208N(2) and 208P(2) in FIG. 2B; the first S/D region in AR 208N(3), the second S/D region in AR 20P(3) and the fourth S/D regions in ARs 208P(4) and 208N(4) in FIG. 2B; or the like. Within block 732, flow proceeds to block 734.

At block 734, M0 segments (e.g., M0 segments 214(1)-214(3)) are formed. Within block 734, flow proceeds to block 736.

At block 736, a first M0 segment (e.g., 214(1)) is formed which overlies the third active region (e.g., 208P(2) of FIG. 2B; 208P(3), 208N(4) of FIG. 2D; or the like) and each of the first (e.g., 210(7)), third (e.g., 210(5)) and fifth (e.g., 210(3)) gate segments. From block 736, flow exits block 734. From block 734, flow proceeds to block 738.

At block 738, V0 structures (e.g., see FIGS. 3A-3B) are formed. From block 738, flow proceeds to block 740.

At block 740, M1 segments (e.g., 216(1)-216(3)) are formed.

Figure 8:
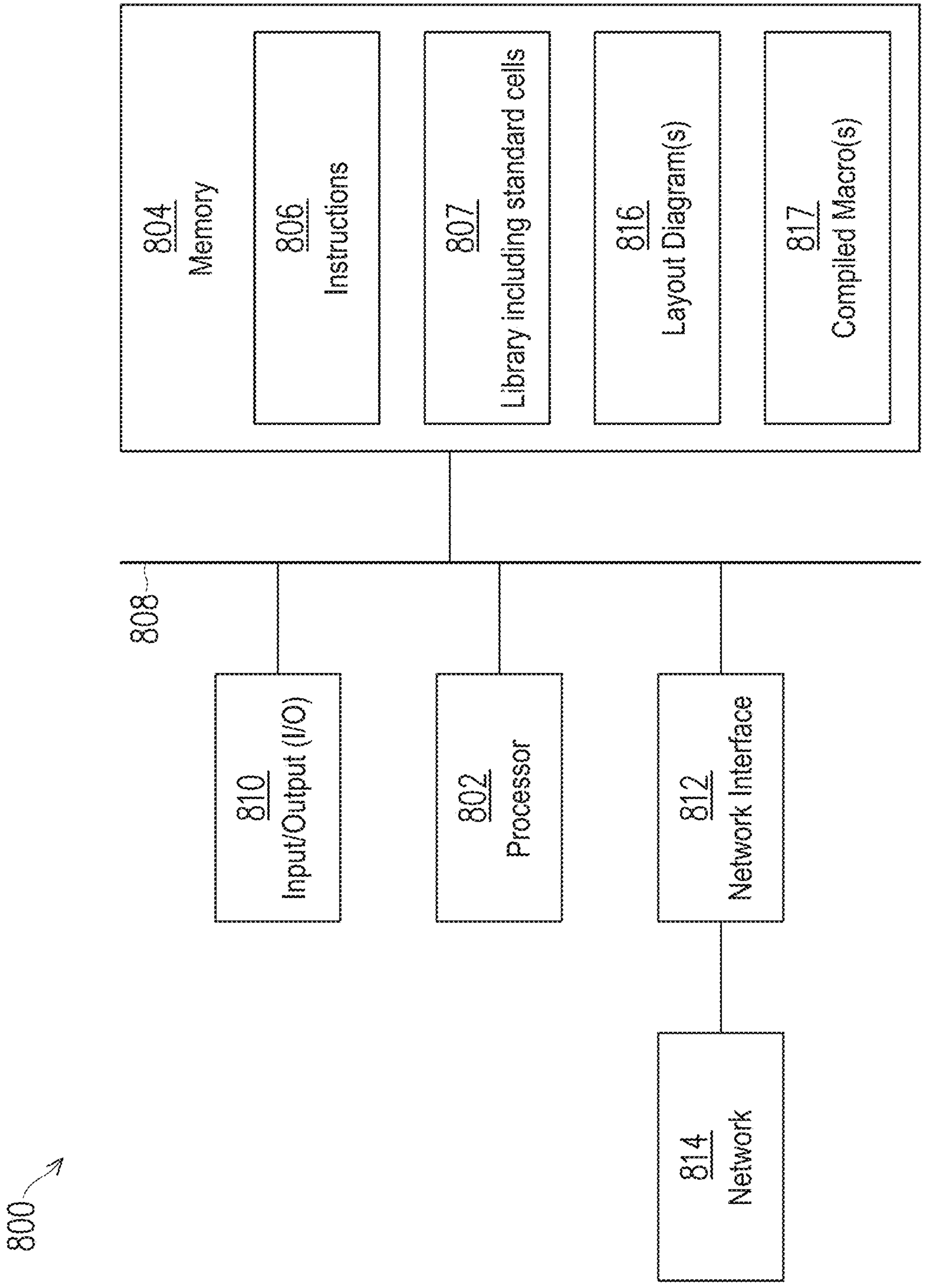
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a processor 802 (e.g., a hardware processor) and a non-transitory, computer-readable storage medium 804. Storage medium 804, amongst other things, is encoded with, i.e., stores, computer program code 806, i.e., a set of executable instructions. Execution of instructions 806 by processor 802 represents (at least in part) an EDA tool which implements a portion of or all, e.g., one or more methods of generating layout diagrams corresponding to the layout diagrams disclosed herein, or the like, in accordance with one or more embodiments (hereinafter, the noted processes and/or methods).

Storage medium 804, amongst other things, stores layout diagrams 811 such as the layout diagrams disclosed herein, other the like.

Processor 802 is electrically coupled to storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and storage medium 804 are capable of connecting to external elements via network 814. Processor 802 is configured to execute computer program code 806 encoded in storage medium 804 in order to cause EDA system 800 to be usable for performing a portion of or all the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, storage medium 804 is an electronic, magnetic, optical, electromagnetic, infrared, and/or a semiconductor system (or apparatus or device). For example, storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, storage medium 804 includes a compact disk-read only memory (CD-ROM), a compact disk-read/write (CD-R/W), and/or a digital video disc (DVD).

In one or more embodiments, storage medium 804 stores instructions, i.e., computer program code 806 configured to cause EDA system 800 (where such execution represents (at least in part) the EDA tool) to be usable for performing a portion of or all the noted processes and/or methods. In one or more embodiments, storage medium 804 further stores information which facilitates performing a portion of or all the noted processes and/or methods. In one or more embodiments, storage medium 804 stores library 807 of standard cells including standard cells that correspond to components of the layout diagrams disclosed herein. Storage medium 804 stores one or more layout diagrams 816 such as one or more layout diagrams corresponding to the layout diagrams disclosed herein, one or more compiled macros 817 based on layout diagrams including one or more of the layout diagrams disclosed herein, or the like.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows EDA system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion of or all noted processes and/or methods, is implemented in two or more EDA systems 800.

EDA system 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion of or all the noted processes and/or methods is implemented as a standalone software application for execution by a processor. In some embodiments, a portion of or all the noted processes and/or methods is implemented as a software application that is a part of an additional software application. In some embodiments, a portion of or all the noted processes and/or methods is implemented as a plug-in to a software application. In some embodiments, at least one of the noted processes and/or methods is implemented as a software application that is a portion of an EDA tool. In some embodiments, a portion of or all the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
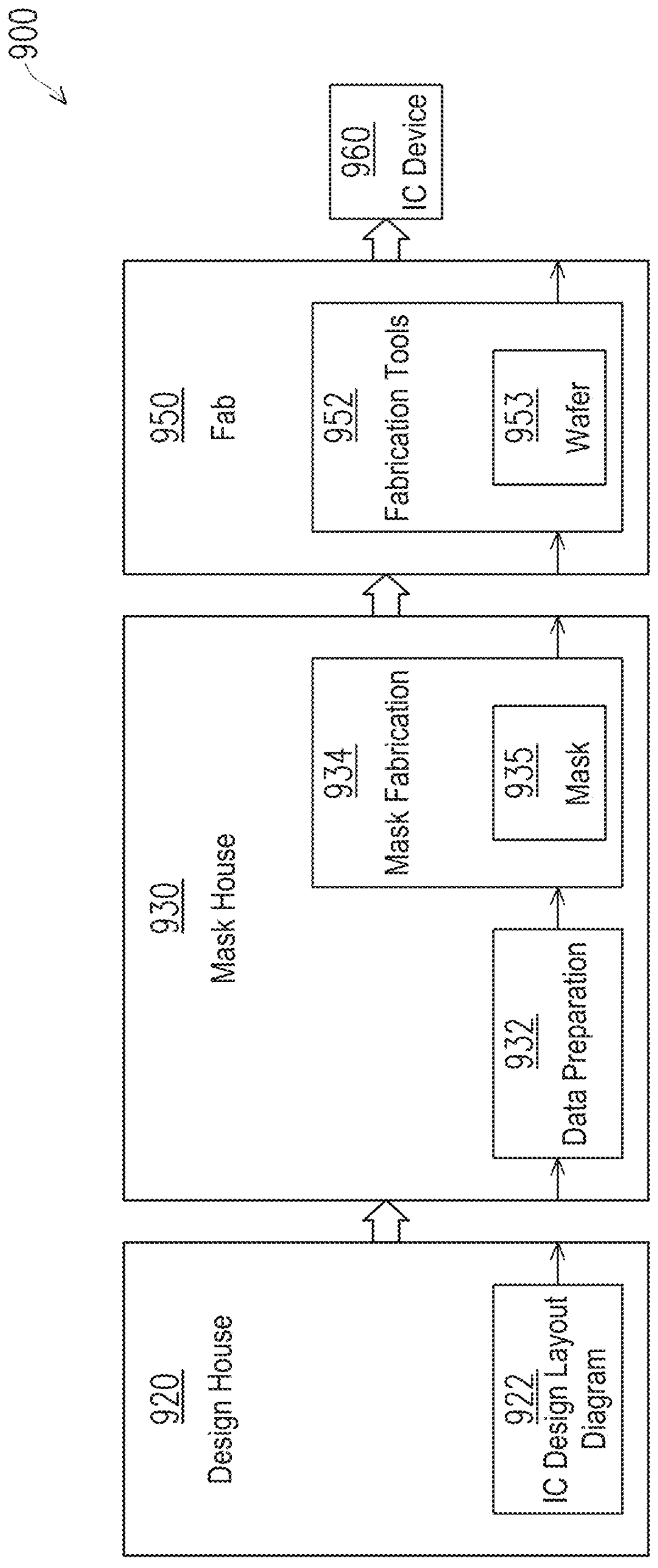
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

In some embodiments, based on the layout diagram generated by block 702 of FIG. 7, the IC manufacturing system 900 implements block 704 of FIG. 7 wherein at least one of (A) one or more semiconductor masks or (B) at least one component in a layer of an inchoate semiconductor integrated circuit is fabricated using manufacturing system 900. In some embodiments, the IC manufacturing system 900 implements the flowcharts of FIG. 6, or the like.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate terminal, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a circuit includes: first and second inverters configured correspondingly to receive first and second pin-signals and to generate inversions of first and second pin-signals, the first and second pin-signals correspondingly being first and second input signals of the circuit; and a three-state inverting sub-circuit including first and second data transistors and a sleep transistor, a control terminal of each of the first and second data transistors being coupled to a first node having the inversion of the second pin-signal, a control terminal of the sleep transistor being coupled to a second node having the inversion the first pin-signal, and the first and second data transistors and the sleep transistor being coupled in series between a third node having a first reference voltage and a fourth node having a non-reference-voltage (NRV) signal.

In some embodiments, the fourth node and the second node are a same node.

In some embodiments, the circuit further includes: a transmission gate coupled between the first node and a fifth node; and wherein the fifth node has a first internal signal; the transmission gate is coupled in parallel with the three-state inverting sub-circuit; a first control terminal of the transmission gate being configured to receive the first pin signal, and a second control terminal of the transmission gate being coupled to the second node for receiving the inversion the first pin-signal.

In some embodiments, regarding the three-state inverting sub-circuit, the first data transistor and the sleep transistor are positive-channel metal-oxide semiconductor (PMOS) field effect transistors (FETs) (PFETs), and the second data transistor is a negative-channel metal-oxide semiconductor (NMOS) FET (NFET); and the first reference voltage is VDD.

In some embodiments, the circuit further includes: a third inverter coupled to the fifth node for receiving the first internal signal and configured to generate an inverted first internal signal, the inverted first internal signal representing an output signal of the circuit; and wherein the circuit is an exclusive OR (XOR) logical circuit.

In some embodiments, the circuit further includes: an AND gate configured to receive the first and second pin-signals and to generate a logical AND signal; and wherein the circuit is a half-adder circuit; the inverted first internal signal represents a sum signal of the half-adder circuit; and the logical AND signal represents an output-carry signal of the half-adder circuit.

In some embodiments, regarding the three-state inverting sub-circuit, the first data transistor is a positive-channel metal-oxide semiconductor (PMOS) field-effect transistors (FETs) (PFETs); the second data transistor and the sleep transistor are negative-channel metal-oxide semiconductor (NMOS) FET) (NFET); and the first reference voltage is VSS.

In some embodiments, the circuit further includes: a third inverter coupled to the fifth node for receiving the first internal signal and configured to generate an inverted first internal signal, the inverted first internal signal representing an output signal of the circuit; and wherein the circuit is an exclusive NOR (XNR) logical circuit.

In some embodiments, the circuit further includes an AND gate configured to receive the first and second pin-signals and to generate a logical AND signal, and wherein: the circuit is a half-adder circuit; the inverted first internal signal represents a sum signal of the half-adder circuit; and the logical AND signal represents an output-carry signal of the half-adder circuit.

In some embodiments, a cell region (of a semiconductor device) includes: active regions (ARs) extending in a first direction and including as follows, first and second ARs of a first type, and a third AR of a second type different; gate segments extending in a second direction perpendicular to the first direction and including as follows, a first gate segment over each of the second and third ARs and being configured to receive a first pin-signal, and a second gate segment over the first AR, being configured to receive an inversion of a second pin-signal, and substantially collinear with the first gate segment; first source/drain (S/D) regions in the second and third ARs and adjacent the second side of the first gate segment being coupled together and configured to provide an inversion of the first pin-signal; second S/D regions in the second and third ARs adjacent the first side of the first gate segment correspondingly being configured to receive different first and second reference voltages; and a first S/D region in the first AR and adjacent the second side of the second gate segment being configured to receive a non-reference-voltage (NRV) signal.

In some embodiments, the NRV signal is a first internal signal which is internal to cell region.

In some embodiments, the gate segments further include as follows, a third gate segment over each of the second and third ARs and being configured to receive the second pin-signal; the third gate segment has first and second sides relative to the first direction, the second side of the third gate segment being adjacent to the first side of the first gate segment; the second S/D regions in the second and third ARs are adjacent the second side of the third gate segment; and third S/D regions in the second and third ARs adjacent the first side of the third gate segment are coupled together and configured to provide an inversion of the second pin-signal.

In some embodiments, the gate segments further include as follows, a fourth gate segment over the second AR and being configured to receive the inversion of the first pin-signal, and a fifth gate segment over the third AR and being configured to receive the first pin-signal; the fourth and fifth gate segments being substantially collinear, the second sides of each of the fourth and fifth gate segments being adjacent to the first side of the third gate segment; the third S/D regions in the second and third ARs correspondingly are adjacent the second sides of the fourth and fifth gate segments; and fourth S/D regions in the second and third ARs correspondingly adjacent the first sides of the fourth and fifth gate segments are coupled together and configured to provide a first internal signal which is internal to cell region.

In some embodiments, the cell region further includes: in a first layer of metallization (M_1st layer), M_1st segments extending in the first direction and including as follows, a first M_1st segment overlying the third AR and each of the first, third and fifth gate segments, and being coupled to each of the first and fifth gate segments.

In some embodiments, the cell region further includes: a first isolation dummy gate (IDG) extending in the second direction and over the first AR, the first IDG being substantially collinear with the third gate segment; the first IDG has first and second sides relative to the first direction, the second side of the first IDG being adjacent to the first side of the second gate segment; a second S/D region in the first AR is adjacent the second side of the first IDG; and a third S/D region in the first AR is adjacent the first side of the first IDG and configured to receive the inversion of the second pin-signal.

In some embodiments, a method (of forming a cell region) includes: forming active regions (ARs) extending in a first direction and including as follows, first and second ARs of a first type, and a third AR of a different second type; doping sub-regions of the ARs to form source/drain (S/D) regions resultingly including as follows, relative to the first direction, first ones of the S/D regions aligning with each other and second ones of the S/D regions aligning with each other, and portions of the ARs which correspondingly are between adjacent first and second S/D regions representing channel regions; forming gate segments extending in a second direction perpendicular to the first direction and resultingly including as follows, a first gate segment over corresponding ones of the channel regions of each of the second and third ARs, and a second gate segment over a corresponding one of the channel regions the first AR, and substantially collinear with the first gate segment, and selectively coupling one or more of the S/D regions or one or more of the gate segments resultingly including as follows, the first gate segment receiving a first pin-signal, the second gate segment receiving an inversion of a second pin-signal, the first S/D regions in the second and third ARs and adjacent the second side of the first gate segment providing an inversion of the first pin-signal, the first S/D region in the third AR and adjacent the second side of the second gate segment receiving the inversion of the first pin-signal; the second S/D regions in the second and third ARs adjacent the first side of the first gate segment correspondingly receiving different first and second reference voltages; and the first S/D region in the first AR and adjacent the second side of the second gate segment receiving a non-reference-voltage (NRV) signal.

In some embodiments, the doping sub-regions further resultingly includes as follows, relative to the first direction, third ones of the S/D regions aligning with each other, and portions of the ARs which correspondingly are between adjacent second and S/D regions representing channel regions; the forming gate segments further resultingly includes as follows, a third gate segment over each of the second and third ARs; the third gate segment has first and second sides relative to the first direction, the second side of the third gate segment being adjacent to the first side of the first gate segment; the forming active regions (ARs) further resultingly includes as follows, the second S/D regions in the second and third ARs being adjacent the second side of the third gate segment; and third S/D regions in the second and third ARs being adjacent the first side of the third gate segment; the selectively coupling further resultingly includes as follows, the third gate segment receiving the second pin-signal, and the third S/D regions in the second and third ARs together providing an inversion of the first pin-signal.

In some embodiments, the doping sub-regions further resultingly includes as follows, relative to the first direction, fourth ones of the S/D regions aligning with each other, and portions of the ARs which correspondingly are between adjacent third and fourth S/D regions representing channel regions; the forming gate segments further resultingly includes as follows, a fourth gate segment over the second AR, and a fifth gate segment over the third AR; the fourth and fifth gate segments being substantially collinear, the second sides of each of the fourth and fifth gate segments being adjacent to the first side of the third gate segment; the forming active regions (ARs) further resultingly includes as follows, the third S/D regions in the second and third ARs correspondingly being adjacent the second sides of the fourth and fifth gate segments; fourth S/D regions in the second and third ARs correspondingly adjacent the first sides of the fourth and fifth gate segments being coupled together and configured to provide a first internal signal which is internal to cell region; and the selectively coupling further resultingly includes as follows, the fourth gate segment receiving to receive the inversion of the first pin-signal, and the fifth gate segment receiving the first pin-signal.

In some embodiments, the method further includes: in a first layer of metallization (M_1st layer), M_1st segments extending in the first direction and resultingly including as follows, a first M_1st segment overlying the third AR and each of the first, third and fifth gate segments; and wherein the selectively coupling further resultingly includes as follows, the first M_1st segment being coupled to each of the first and fifth gate segments.

In some embodiments, the method further includes: forming a first isolation dummy gate (IDG) extending in the second direction and over the first AR, the first IDG being substantially collinear with the third gate segment; and wherein the first IDG has first and second sides relative to the first direction, the second side of the first IDG being adjacent to the first side of the second gate segment; the second S/D region in the first AR is adjacent the second side of the first IDG; a third S/D region in the first AR is adjacent the first side of the first IDG; and the selectively coupling further resultingly includes as follows, coupling the third S/D region in the first AR receiving the inversion of the second pin-signal.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A circuit comprising:

first and second inverters configured correspondingly to receive first and second pin-signals and to generate inversions of first and second pin-signals, the first and second pin-signals correspondingly being first and second input signals of the circuit; and a three-state inverting sub-circuit including first and second data transistors and a sleep transistor, a control terminal of each of the first and second data transistors being coupled to a first node having the inversion of the second pin-signal, a control terminal of the sleep transistor being coupled to a second node having the inversion the first pin-signal, and the first and second data transistors and the sleep transistor being coupled in series between a third node having a first reference voltage and a fourth node having a non-reference-voltage (NRV) signal.

2. The circuit of claim 1, wherein:

the fourth node and the second node are a same node.

3. The circuit of claim 2, further comprising:

a transmission gate coupled between the first node and a fifth node; and wherein:

the fifth node has a first internal signal;

the transmission gate is coupled in parallel with the three-state inverting sub-circuit;

a first control terminal of the transmission gate being configured to receive the first pin signal, and a second control terminal of the transmission gate being coupled to the second node for receiving the inversion the first pin-signal.

4. The circuit of claim 3, wherein:

regarding the three-state inverting sub-circuit, the first data transistor and the sleep transistor are positive-channel metal-oxide semiconductor (PMOS) field effect transistors (FETs) (PFETs), and the second data transistor is a negative-channel metal-oxide semiconductor (NMOS) FET (NFET); and the first reference voltage is VDD.

5. The circuit of claim 4, further comprising:

a third inverter coupled to the fifth node for receiving the first internal signal and configured to generate an inverted first internal signal, the inverted first internal signal representing an output signal of the circuit; and wherein the circuit is an exclusive OR (XOR) logical circuit.

6. The circuit of claim 5, further comprising:

an AND gate configured to receive the first and second pin-signals and to generate a logical AND signal; and wherein:

the circuit is a half-adder circuit;

the inverted first internal signal represents a sum signal of the half-adder circuit; and the logical AND signal represents an output-carry signal of the half-adder circuit.

7. The circuit of claim 3, wherein:

regarding the three-state inverting sub-circuit, the first data transistor is a positive-channel metal-oxide semiconductor (PMOS) field-effect transistor (FET) (PFET), and the second data transistor and the sleep transistor are negative-channel metal-oxide semiconductor (NMOS) FETs (NFETs); and the first reference voltage is VSS.

8. The circuit of claim 7, further comprising:

a third inverter coupled to the fifth node for receiving the first internal signal and configured to generate an inverted first internal signal, the inverted first internal signal representing an output signal of the circuit; and wherein the circuit is an exclusive NOR (XNR) logical circuit.

9. The circuit of claim 8, further comprising:

an AND gate configured to receive the first and second pin-signals and to generate a logical AND signal; and wherein:

the circuit is a full adder circuit;

the inverted first internal signal represents a sum signal of the full adder circuit; and the logical AND signal represents an output-carry signal of the full adder circuit.

10. A cell region of a semiconductor device, the cell region comprising:

active regions (ARs) extending in a first direction and including as follows, first and second ARs of a first type, and a third AR of a different second type;

gate segments extending in a second direction perpendicular to the first direction and including as follows, a first gate segment over each of the second and third ARs and being configured to receive a first pin-signal, and a second gate segment over the first AR, being configured to receive an inversion of a second pin-signal, and substantially collinear with the first gate segment;

first source/drain (S/D) regions in the second and third ARs and adjacent the second side of the first gate segment being coupled together and configured to provide an inversion of the first pin-signal;

second S/D regions in the second and third ARs adjacent the first side of the first gate segment correspondingly being configured to receive different first and second reference voltages; and a first S/D region in the first AR and adjacent the second side of the second gate segment being configured to receive a non-reference-voltage (NRV) signal.

11. The cell region of claim 10, wherein:

the NRV signal is a first internal signal which is internal to cell region.

12. The cell region of claim 10, wherein:

the gate segments further include as follows, a third gate segment over each of the second and third ARs and being configured to receive the second pin-signal;

the third gate segment has first and second sides relative to the first direction, the second side of the third gate segment being adjacent to the first side of the first gate segment;

the second S/D regions in the second and third ARs are adjacent the second side of the third gate segment; and third S/D regions in the second and third ARs adjacent the first side of the third gate segment are coupled together and configured to provide an inversion of the second pin-signal.

13. The cell region of claim 12, wherein:

the gate segments further include as follows, a fourth gate segment over the second AR and being configured to receive the inversion of the first pin-signal, and a fifth gate segment over the third AR and being configured to receive the first pin-signal;

the fourth and fifth gate segments being substantially collinear, the second sides of each of the fourth and fifth gate segments being adjacent to the first side of the third gate segment;

the third S/D regions in the second and third ARs correspondingly are adjacent the second sides of the fourth and fifth gate segments; and fourth S/D regions in the second and third ARs correspondingly adjacent the first sides of the fourth and fifth gate segments are coupled together and configured to provide a first internal signal which is internal to cell region.

14. The cell region of claim 13, further comprising:

in a first layer of metallization (M_1st layer), M_1st segments extending in the first direction and including as follows, a first M_1st segment overlying the third AR and each of the first, third and fifth gate segments, and being coupled to each of the first and fifth gate segments.

15. The cell region of claim 12, further comprising:

a first isolation dummy gate (IDG) extending in the second direction and over the first AR, the first IDG being substantially collinear with the third gate segment;

the first IDG has first and second sides relative to the first direction, the second side of the first IDG being adjacent to the first side of the second gate segment;

a second S/D region in the first AR is adjacent the second side of the first IDG; and a third S/D region in the first AR is adjacent the first side of the first IDG and configured to receive the inversion of the second pin-signal.

16. A method of manufacturing a cell region, the method comprising:

forming active regions (ARs) extending in a first direction and resultingly including as follows, first and second ARs of a first type, and a third AR of a different second type;

doping sub-regions of the ARs to form source/drain (S/D) regions resultingly including as follows, relative to the first direction, first ones of the S/D regions aligning with each other and second ones of the S/D regions aligning with each other, and portions of the ARs which correspondingly are between adjacent first and second S/D regions representing channel regions;

forming gate segments extending in a second direction perpendicular to the first direction and resultingly including as follows, a first gate segment over corresponding ones of the channel regions of each of the second and third ARs, and a second gate segment over a corresponding one of the channel regions the first AR, and substantially collinear with the first gate segment; and selectively coupling one or more of the S/D regions or one or more of the gate segments resultingly including as follows, the first gate segment receiving a first pin-signal, the second gate segment receiving an inversion of a second pin-signal, the first S/D regions in the second and third ARs and adjacent the second side of the first gate segment providing an inversion of the first pin-signal, the first S/D region in the third AR and adjacent the second side of the second gate segment receiving the inversion of the first pin-signal;

the second S/D regions in the second and third ARs adjacent the first side of the first gate segment correspondingly receiving different first and second reference voltages; and the first S/D region in the first AR and adjacent the second side of the second gate segment receiving a non-reference-voltage (NRV) signal.

17. The method of claim 16, wherein:

the doping sub-regions further resultingly includes as follows, relative to the first direction, third ones of the S/D regions aligning with each other, and portions of the ARs which correspondingly are between adjacent second and S/D regions representing channel regions;

the forming gate segments further resultingly includes as follows, a third gate segment over each of the second and third ARs;

the third gate segment has first and second sides relative to the first direction, the second side of the third gate segment being adjacent to the first side of the first gate segment;

the forming active regions (ARs) further resultingly includes as follows, the second S/D regions in the second and third ARs being adjacent the second side of the third gate segment; and third S/D regions in the second and third ARs being adjacent the first side of the third gate segment;

the selectively coupling further resultingly includes as follows, the third gate segment receiving the second pin-signal, and the third S/D regions in the second and third ARs together providing an inversion of the first pin-signal.

18. The method of claim 17, wherein:

the doping sub-regions further resultingly includes as follows, relative to the first direction, fourth ones of the S/D regions aligning with each other, and portions of the ARs which correspondingly are between adjacent third and fourth S/D regions representing channel regions;

the forming gate segments further resultingly includes as follows, a fourth gate segment over the second AR, and a fifth gate segment over the third AR;

the fourth and fifth gate segments being substantially collinear, and the second sides of each of the fourth and fifth gate segments being adjacent to the first side of the third gate segment;

the forming active regions (ARs) further resultingly includes as follows, the third S/D regions in the second and third ARs correspondingly being adjacent the second sides of the fourth and fifth gate segments, fourth S/D regions in the second and third ARs correspondingly adjacent the first sides of the fourth and fifth gate segments being coupled together and configured to provide a first internal signal which is internal to cell region; and the selectively coupling further resultingly includes as follows, the fourth gate segment receiving to receive the inversion of the first pin-signal, and the fifth gate segment receiving the first pin-signal.

19. The cell region of claim 18, further comprising:

in a first layer of metallization (M_1st layer), forming M_1st segments extending in the first direction and resultingly including as follows, a first M_1st segment overlying the third AR and each of the first, third and fifth gate segments; and wherein the selectively coupling further resultingly includes as follows, the first M_1st segment being coupled to each of the first and fifth gate segments.

20. The method of claim 17, further comprising:

forming a first isolation dummy gate (IDG) extending in the second direction and over the first AR, the first IDG being substantially collinear with the third gate segment; and wherein:

the first IDG has first and second sides relative to the first direction, the second side of the first IDG being adjacent to the first side of the second gate segment;

the second S/D region in the first AR is adjacent the second side of the first IDG;

a third S/D region in the first AR is adjacent the first side of the first IDG; and the selectively coupling further resultingly includes as follows, coupling the third S/D region in the first AR receiving the inversion of the second pin-signal.

* * * * *